United States Patent
Lin et al.

(10) Patent No.: US 11,532,502 B2
(45) Date of Patent: Dec. 20, 2022

(54) REDUCING PARASITIC CAPACITANCE IN FIELD-EFFECT TRANSISTORS

(71) Applicant: Taiwan Semiconductor Manufacturing Co., Ltd., Hsin-Chu (TW)

(72) Inventors: Ta-Chun Lin, Hsinchu (TW); Kuo-Hua Pan, Hsinchu (TW); Jhon Jhy Liaw, Hsinchu County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 72 days.

(21) Appl. No.: 17/150,725

(22) Filed: Jan. 15, 2021

(65) Prior Publication Data

US 2021/0305084 A1    Sep. 30, 2021

Related U.S. Application Data

(60) Provisional application No. 63/002,489, filed on Mar. 31, 2020.

(51) Int. Cl.
| | | |
|---|---|---|
| *H01L 21/764* | (2006.01) | |
| *H01L 29/423* | (2006.01) | |
| *H01L 21/8234* | (2006.01) | |
| *H01L 27/088* | (2006.01) | |
| *H01L 29/786* | (2006.01) | |

(52) U.S. Cl.
CPC .... *H01L 21/764* (2013.01); *H01L 21/823481* (2013.01); *H01L 27/088* (2013.01); *H01L 29/42392* (2013.01); *H01L 29/78696* (2013.01)

(58) Field of Classification Search
CPC ........... H01L 21/823418; H01L 21/764; H01L 29/0673; H01L 29/785; H01L 29/0649; H01L 29/42392
See application file for complete search history.

(56) References Cited

U.S. PATENT DOCUMENTS

| | | | |
|---|---|---|---|
| 9,679,965 B1* | 6/2017 | Suk | ................... H01L 29/42392 |
| 2017/0012042 A1* | 1/2017 | Cai | ...................... H01L 29/0649 |
| 2019/0103317 A1 | 4/2019 | Yu et al. | |
| 2020/0091124 A1 | 3/2020 | Liao et al. | |

FOREIGN PATENT DOCUMENTS

| | | |
|---|---|---|
| KR | 2019003828 A | 4/2019 |
| TW | 201913819 A | 4/2019 |
| TW | 201913878 A | 4/2019 |
| TW | 202002026 A | 1/2020 |
| TW | 202011458 A | 3/2020 |

* cited by examiner

*Primary Examiner* — Changhyun Yi
(74) *Attorney, Agent, or Firm* — Haynes and Boone, LLP

(57) ABSTRACT

A semiconductor structure includes a semiconductor fin protruding from a substrate, an S/D feature disposed over the semiconductor fin, and a first dielectric fin and a second dielectric fin disposed over the substrate, where the semiconductor fin is disposed between the first dielectric fin and the second dielectric fin, where a first air gap is enclosed by a first sidewall of the epitaxial S/D feature and the first dielectric fin, and where a second air gap is enclosed by a second sidewall of the epitaxial S/D feature and the second dielectric fin.

20 Claims, 18 Drawing Sheets

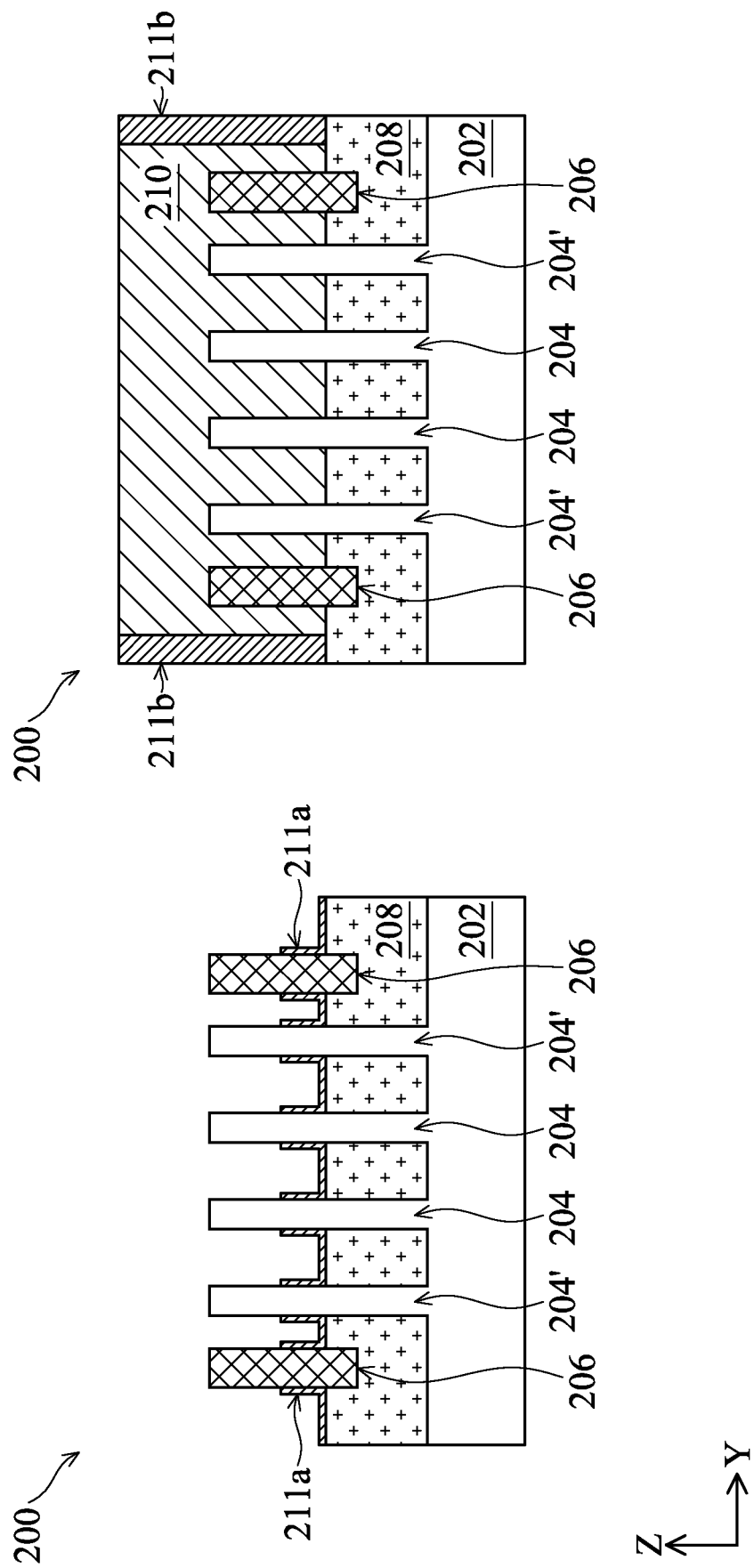

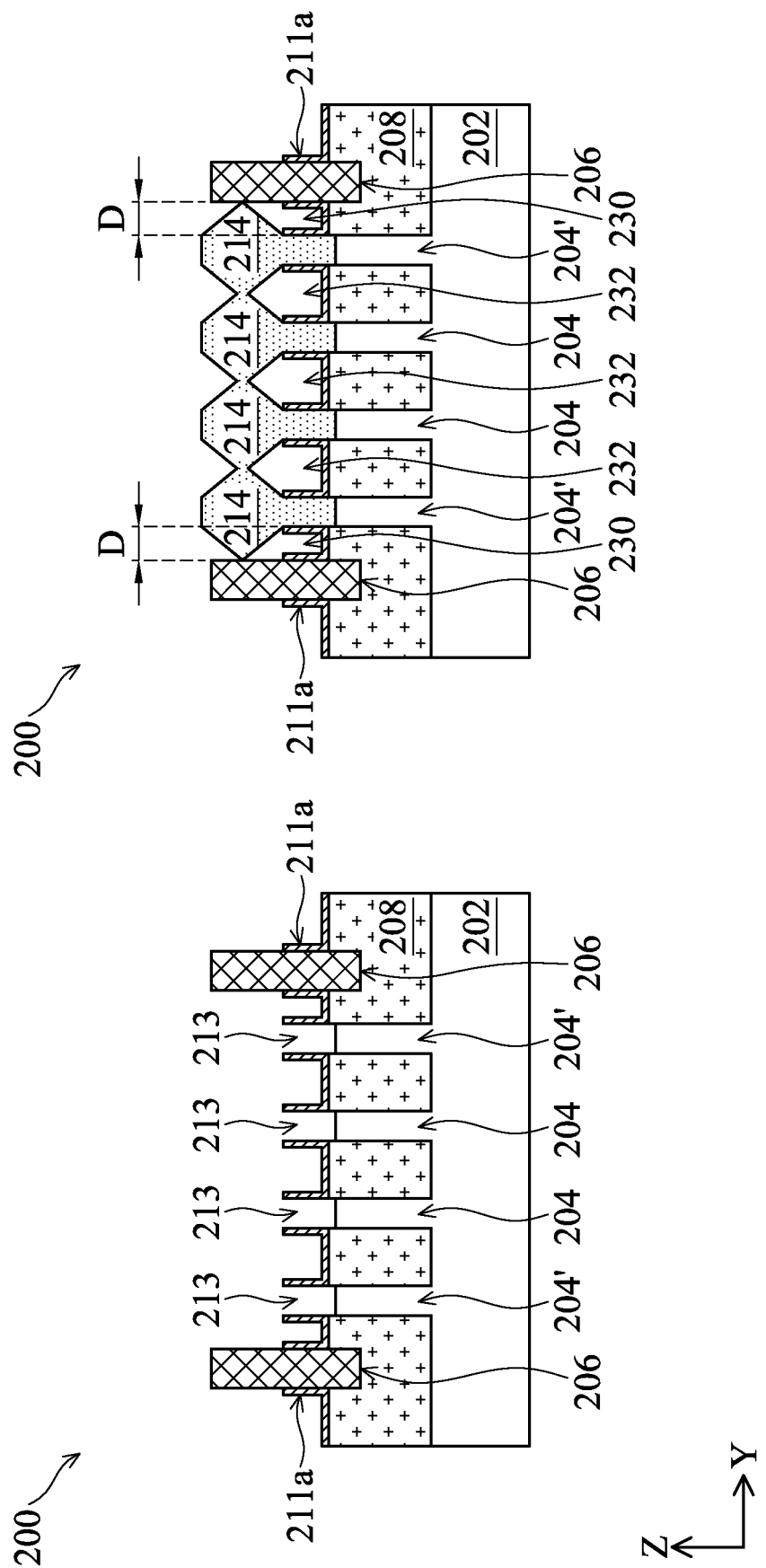

REDUCING PARASITIC CAPACITANCE IN FIELD-EFFECT TRANSISTORS

CROSS-REFERENCE TO RELATED APPLICATIONS

This is a non-provisional application of and claims priority to U.S. Provisional Patent Application Ser. No. 63/002,489, filed Mar. 31, 2020, the entire disclosure of which is incorporated herein by reference.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

Three-dimensional field effect transistors, such as fin-like FETs (FinFETs) and gate-all-around (GAA) FETs (GAA FETs), have been incorporated into various memory and core devices to reduce IC chip footprint while maintaining reasonable processing margins. While methods of forming these FETs have generally been adequate, they have not been entirely satisfactory in all aspects. For example, lowering parasitic capacitance by introducing air gaps to device structures when the number of active regions (i.e., fins) reduces to two or less remains a challenge. Thus, for at least this reason, improvements in methods of fabricating FinFETs, GAA FETs, and the alike are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 11A, 12A, 13, 14, 15A, 15B, 16A, 16B, 16C, 16D, 17A, 17B, 18A, and 18B are cross-sectional views of the semiconductor device taken along line AA' of FIG. 10A and/or FIG. 10B at various stages of the method shown in FIG. 1, according to various embodiments of the present disclosure.

FIGS. 10C, 11B, 12B, 19A, 19B, 20A, and 20B are cross-sectional views of the semiconductor device taken along line BB' of FIG. 10A and/or FIG. 10B at various stages of the method shown in FIG. 1, according to various embodiments of the present disclosure.

DETAILED DESCRIPTION

Figure 1:
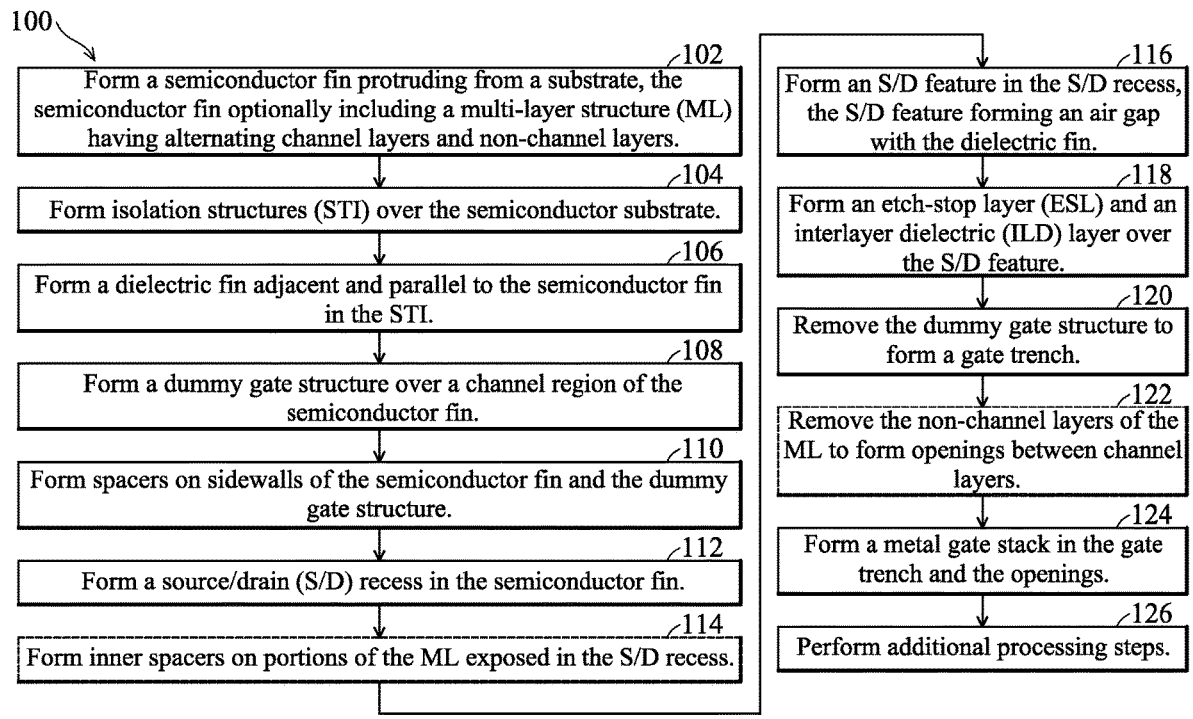
FIG. 1 illustrates a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure provides methods of reducing parasitic capacitance in field-effect transistors (FETs) including fin-like FETs (FinFETs) and multi-gate FETs such as gate-all-around (GAA) FETs. Each FinFET includes a three-dimensional channel region that engages with a gate structure, while each GAA FET includes a vertical stack of nanosheets, nanowires, or nanorods as channel regions interleaved with the gate structure. Some embodiments provide methods of lowering parasitic capacitance when a number of fins (or active regions) in a given FET structure is reduced to two or less. Embodiments of the present disclosure may be readily integrated into existing process flow for forming epitaxial S/D features in FinFETs, GAA FETs, and/or other suitable FETs.

Referring to FIG. 1, a flowchart of method 100 of forming a semiconductor device 200 (hereafter simply referred to as the device 200) are illustrated according to various aspects of the present disclosure. Method 100 is merely an example and is not intended to limit the present disclosure beyond what is explicitly recited in the claims. Additional operations can be provided before, during, and after method 100, and some operations described can be replaced, eliminated, or moved around for additional embodiments of the method. Method 100 is described below in conjunction with FIGS.

Figure 2:
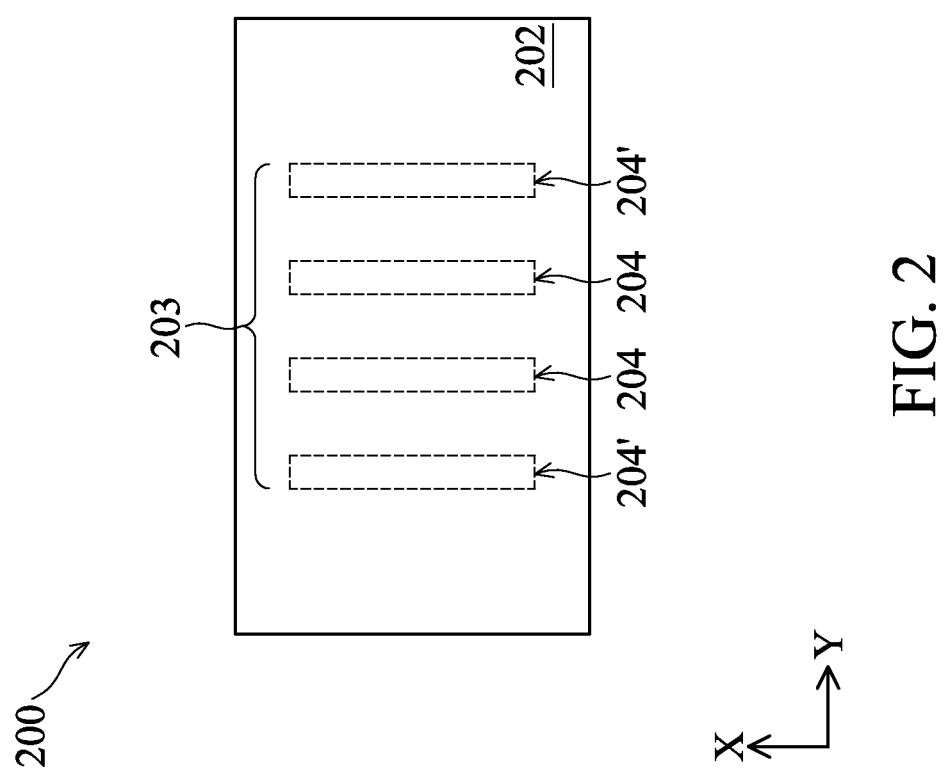
FIGS. 2 and 10A are planar top views of an example semiconductor device at various stages of the method shown in FIG. 1, according to various embodiments of the present disclosure.
Figure 9:
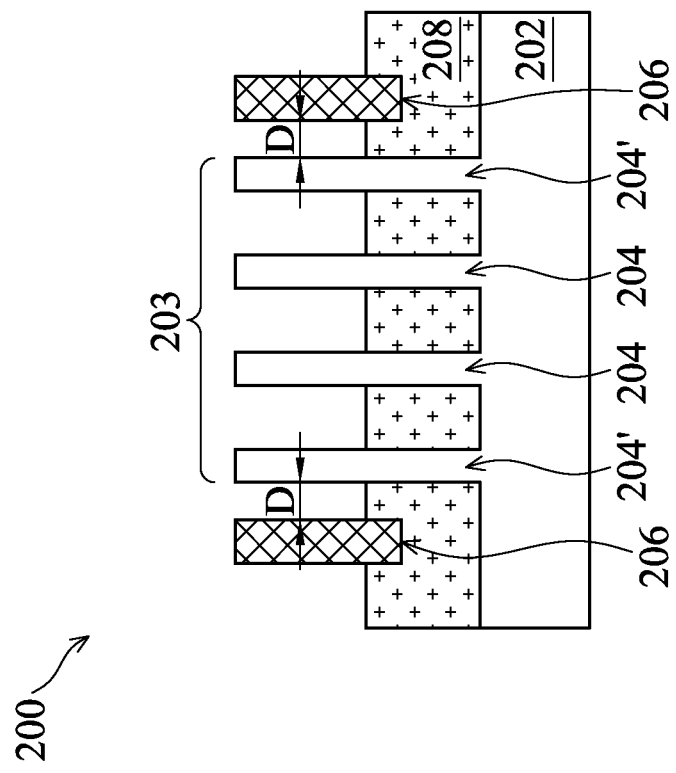
Figures 10A, 10B:
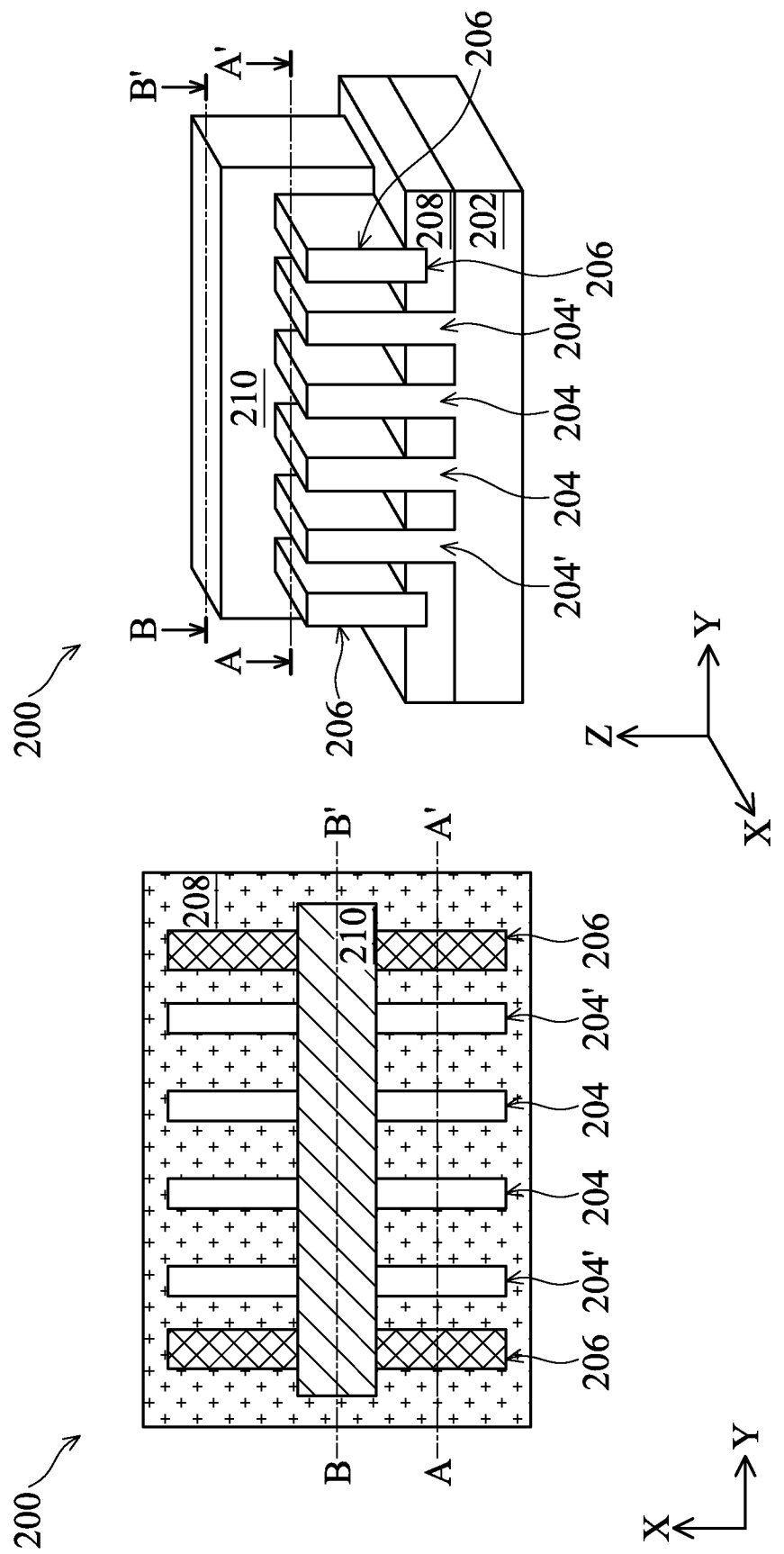
FIG. 10B is a three-dimensional perspective view of the semiconductor device shown in FIG. 10A, according to various embodiments of the present disclosure.

2-20B, where FIGS. 2 and 10A illustrate planar top views, FIGS. 3-9, 10C-20B illustrate cross-sectional views, FIG. 10B illustrates a three-dimensional perspective view of the device 200. Specifically, FIGS. 11A, 12A, and 13-18B illustrate cross-sectional views of the device 200 taken along line AA' as shown in FIGS. 10A and/or 10B, and FIGS. 11B, 12B, and 19A-20B illustrate cross-sectional views of the device 200 taken along line BB' as shown in FIGS. 10A and/or 10B. The device 200 may be an intermediate device fabricated during processing of an IC, or a portion thereof, that may comprise static random-access memory (SRAM) and/or other logic circuits, passive components such as resistors, capacitors, and inductors, and active components such as FinFETs, GAA FETs, metal-oxide semiconductor field effect transistors (MOSFETs), complementary metal-oxide semiconductor (CMOS) transistors, bipolar transistors, high voltage transistors, high frequency transistors, and/or other transistors. The present disclosure is not limited to any particular number of devices or device regions, or to any particular device configurations. Additional features can be added to the device 200, and some of the features described below can be replaced, modified, or eliminated in other embodiments of the device 200.

Figure 3:
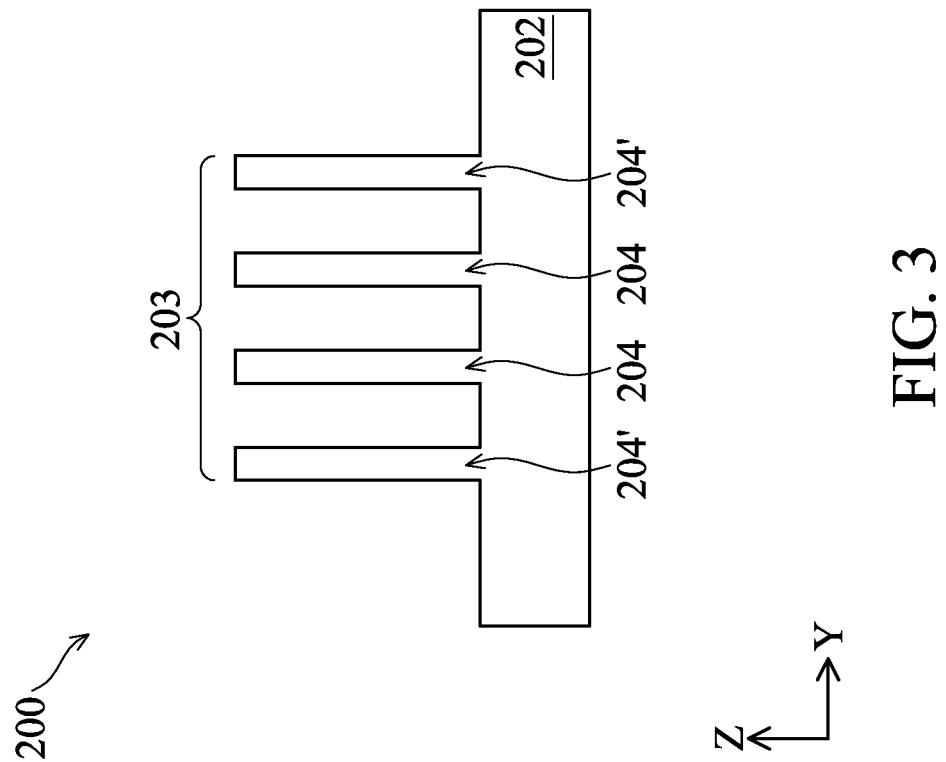
FIGS. 3, 4, 5A, 5B, 6, 7, 8, and 9 are cross-sectional views of the semiconductor device at various stages of the method shown in FIG. 1, according to various embodiments of the present disclosure.

At operation 102, referring to FIGS. 2 and 3, method 100 forms a device region 203 over a semiconductor substrate (hereafter referred to as the "substrate") 202, where the device region 203 is configured to provide one or more FETs. The device region 203 includes at least one semiconductor fin protruding from the substrate 202 and oriented lengthwise along the X direction. In some embodiments, as depicted herein, the device region 203 includes an array of multiple semiconductor fins 204 and 204' spaced from each other along the Y direction, where inner semiconductor fins 204 are interposed between two outer semiconductor fins 204'. The outer semiconductor fins 204' are identical to the inner semiconductor fins 204 in composition and structure but differ in their relative positions within the device region 203. In the present embodiments, the outer semiconductor fins 204' define two edges of the device region 203 (and thus may alternatively be referred to as edge semiconductor fins 204') along the X direction. In this regard, if a total number N of all the semiconductor fins disposed in the device region 203 is greater than or equal to two, then the number of outer semiconductor fins 204' is two and the number of inner semiconductor fins 204 is (N−2). In one example, if N is four as depicted herein, then the number of the outer semiconductor fins 204' is two and the number of the inner semiconductor fins 204 is also two. In another example, if N is two, then the number of the outer semiconductor fins 204' is two and the number of the inner semiconductor fins 204 is zero, i.e., both of the semiconductor fins are considered outer semiconductor fins 204'. In some embodiments, the device region 203 includes only one outer semiconductor fin 204' (see, for example, FIGS. 17B, 18A, and 18B). In other words, if N is less than or equal to two, then the semiconductor fin(s) in the device region 203 are all considered outer semiconductor fin(s) 204'; otherwise, the device region 203 includes a mixture of outer semiconductor fins 204' and inner semiconductor fins 204.

Referring to FIG. 2, a top view of the device 200 depicts a portion of the substrate 202 over which the device region 203 is formed. Referring to FIG. 3, which is a cross-sectional view of the device 200, method 100 at operation 102 forms the semiconductor fins 204 and/or 204' from the substrate 202. The semiconductor fins 204 and/or 204' may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the semiconductor fins 204 and/or 204' on the substrate 202. The etching process may include dry etching, wet etching, reactive ion etching (RIE), and/or other suitable processes.

Numerous other embodiments of methods for forming the semiconductor fins 204 and/or 204' may be suitable. For example, the semiconductor fins 204 and/or 204' may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 204 and/or 204'.

The substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing.

In some examples, various doped regions may be disposed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or in a raised structure. Doped regions may be formed by implantation of dopant atoms, in-situ doped epitaxial growth, and/or other suitable techniques. Of course, these examples are for illustrative purposes only and are not intended to be limiting.

Figure 4:
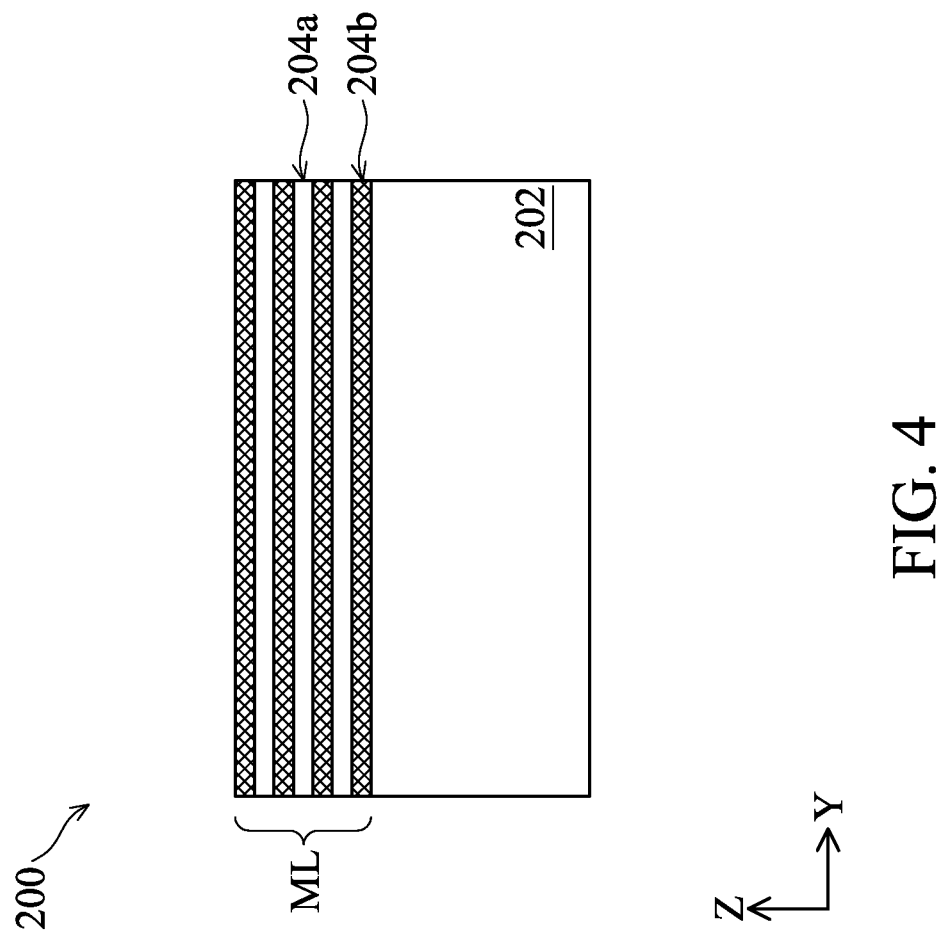
Figures 5A, 5B:
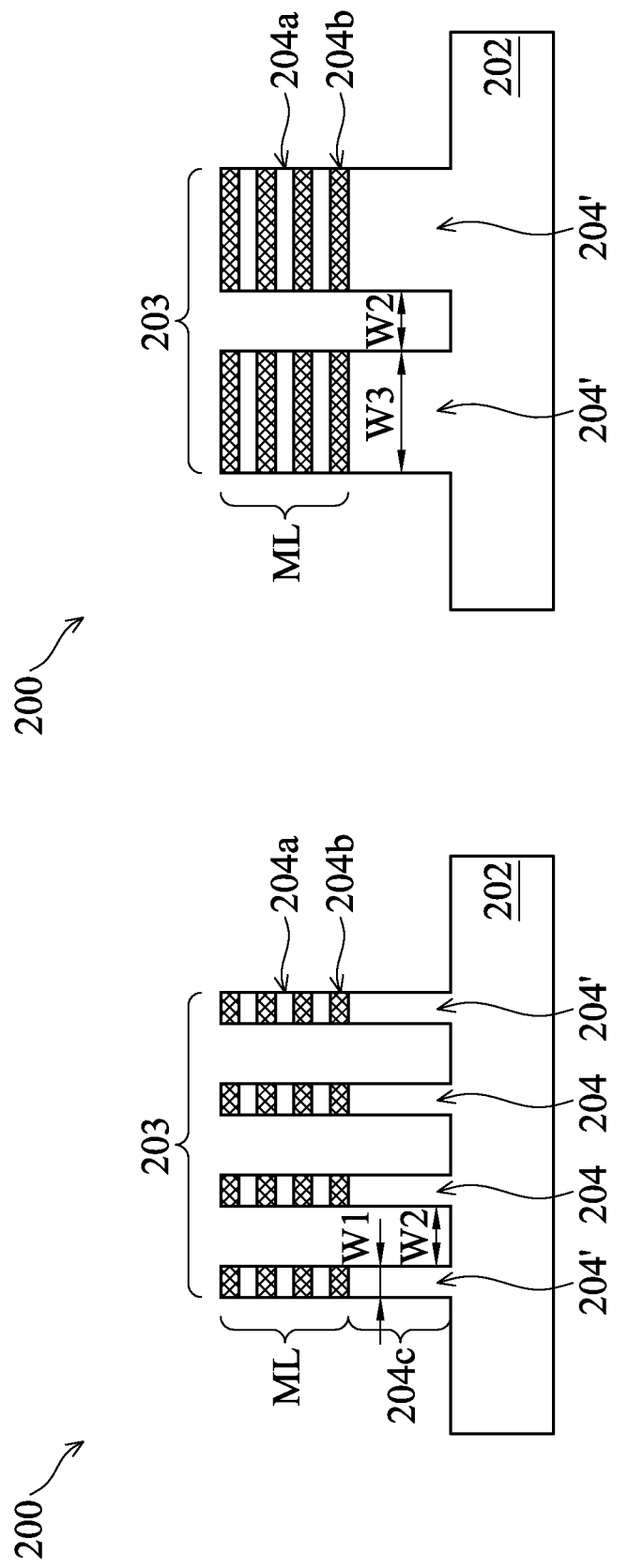

In some embodiments, referring to FIGS. 4, 5A, and 5B, the device region 203 is configured to provide one or more GAA FETs, where a multi-layer stack (ML) is formed over the substrate 202 and the semiconductor fins 204 and/or 204' are subsequently formed from the ML and the substrate 202 at operation 102. Referring to FIG. 4, the ML includes alternating layers 204a and 204b, where the layer 204a comprises a semiconductor material such as, for example, Si, Ge, SiC, SiGe, GeSn, SiGeSn, SiGeCSn, other suitable semiconductor materials, or combinations thereof, configured as channel regions of the GAA FET, and the layer 204b is a sacrificial layer configured to be removed at a subsequent processing step and replaced by a gate structure. In some embodiments, each layer 204b includes a semiconductor material different from the semiconductor material of the layer 204a. In one such example, the layer 204a may include elemental Si and the layer 204b may include SiGe. In another example, the layer 204a may include elemental Si, while the layer 204b may include elemental Ge. The ML may be arranged with the layer 204b directly contacting the substrate 202 and the layer 204a subsequently disposed on the layer 204b as depicted herein; alternatively, the ML may be arranged with the layer 204a directly disposed on the substrate 202 and the layer 204b disposed on the layer 204a. In some examples, the ML may include a total of three to ten pairs of alternating layers 204a and 204b; of course, other configurations may also be applicable depending upon specific design requirements.

In the present embodiments, forming the ML includes alternatingly growing the layers 204a and 204b in a series of epitaxy processes including chemical vapor deposition (CVD) techniques (for example, vapor-phase epitaxy (VPE), ultra-high vacuum CVD (UHV-CVD), low-pressure CVD (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors containing Si and/or Ge, which interact with the composition of the underlying substrate.

Subsequently, referring to FIGS. 5A and 5B, method 100 forms one or more semiconductor fins 204 and/or 204' from the ML and the substrate 202. In the present embodiments, each semiconductor fin 204 or 204' includes a base fin 204c protruding from the substrate 202 and the stack of alternating layers 204a and 204b (i.e., the ML) disposed over the base fin 204c. Methods of forming the semiconductor fins 204 and/or 204' are discussed in detail above with respect to FIG. 3. The semiconductor fins 204 and/or 204' may be formed into various configurations depending upon desired design requirements. For example, the layers 204a and 204b may be formed into nanowires as depicted in FIG. 5A, nanosheets as depicted in FIG. 5B, or nanorods (not depicted). In some embodiments, referring to FIG. 5A, a width W1 of each nanowire measured along the Y direction is less than or equal to a separation distance W2 between two adjacent semiconductor fins 204 and/or 204'. In some embodiments, referring to FIG. 5B, a width W3 of each nanosheet measured along the Y direction is at least the same as the separation distance W2 between adjacent semiconductor fins 204 and/or 204'. A wire (or sheet) release process may then remove the layers 204b to form multiple openings between the layers 204a, and metal gate structures are subsequently formed in the openings, thereby forming GAA FETs with the channel layers. For this reason, the layers 204a are hereafter referred to as channel layers 204a, and the layers 204b are hereafter referred to as non-channel layers 204b. It is noted that embodiments of method 100 disclosed herein are equally applicable to semiconductor fins 204 and/or 204' having one channel layer (i.e., a uniform fin) as depicted in FIG. 3 and/or having multiple channel layers 204a as depicted in FIGS. 5A and 5B. For illustrative purposes, subsequent operations 104 to 118 of method 100 are discussed in reference to the semiconductor fins 204 and/or 204' having a uniform fin structure as depicted in FIG. 3.

Figures 6, 7:
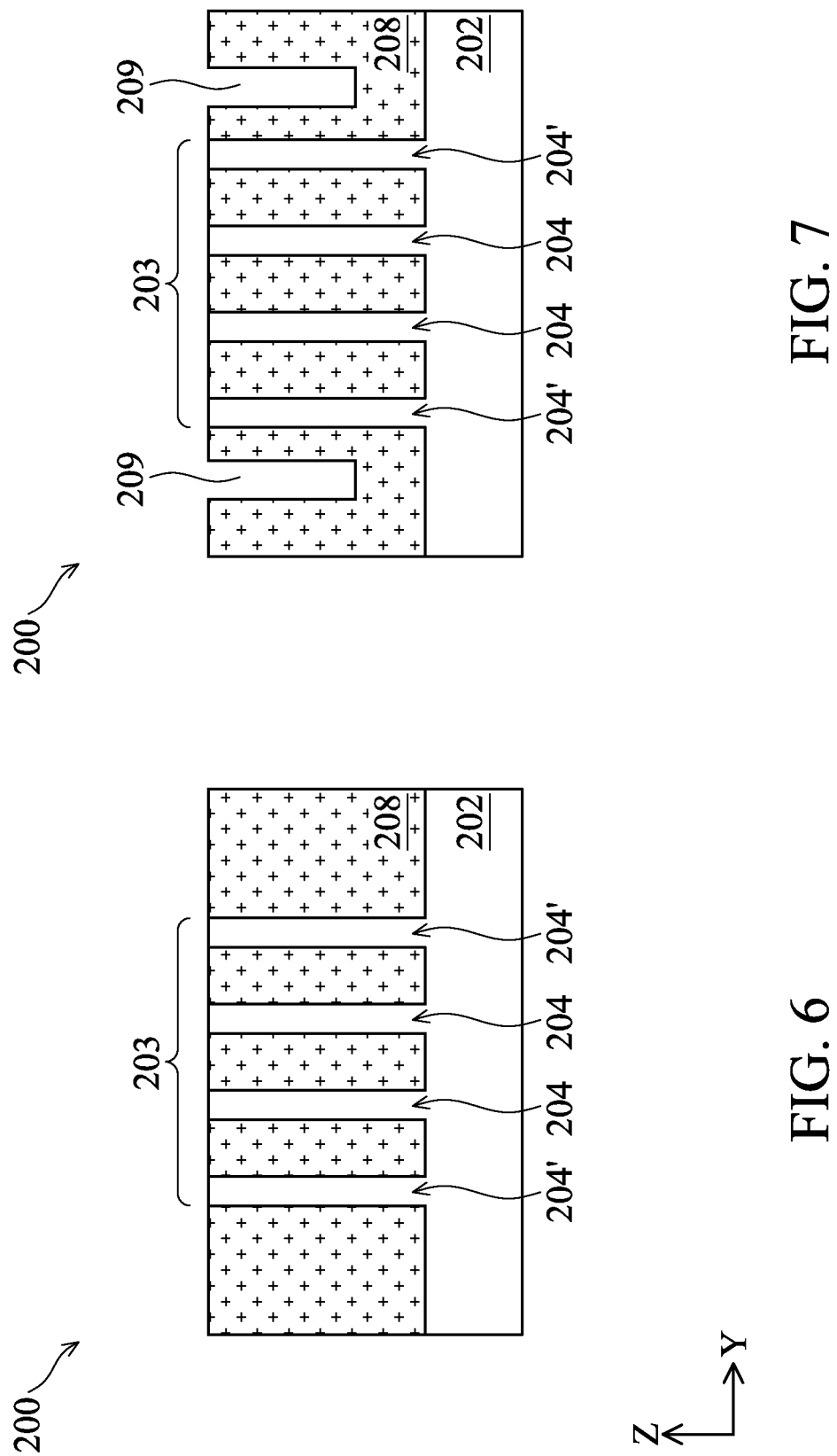

Now referring to FIG. 6, method 100 forms isolation structures 208 over the substrate 202, thereby filling spaces between the semiconductor fins 204 and/or 204'. The isolation structures 208 may include silicon oxide (SiO and/or $SiO_2$), fluoride-doped silicate glass (FSG), a low-k dielectric material, and/or other suitable materials. The isolation structures 208 may include shallow trench isolation (STI) features. Other isolation structure such as field oxide, local oxidation of silicon (LOCOS), other suitable structures, or combinations thereof may also be implemented as the isolation structures 208. The isolation structures 208 may be a single-layer structure or a multi-layer structure, for example, having one or more thermal oxide liner layers. The isolation structures 208 may be deposited by any suitable method, such as CVD, flowable CVD (FCVD), spin-on-glass (SOG), other suitable methods, or combinations thereof. Thereafter, one or more chemical mechanical planarization (CMP) processes are performed to the isolation structures 208 to planarize a top surface of the device 200 and to expose top surface of the semiconductor fins 204 and/or 204'.

Figure 8:
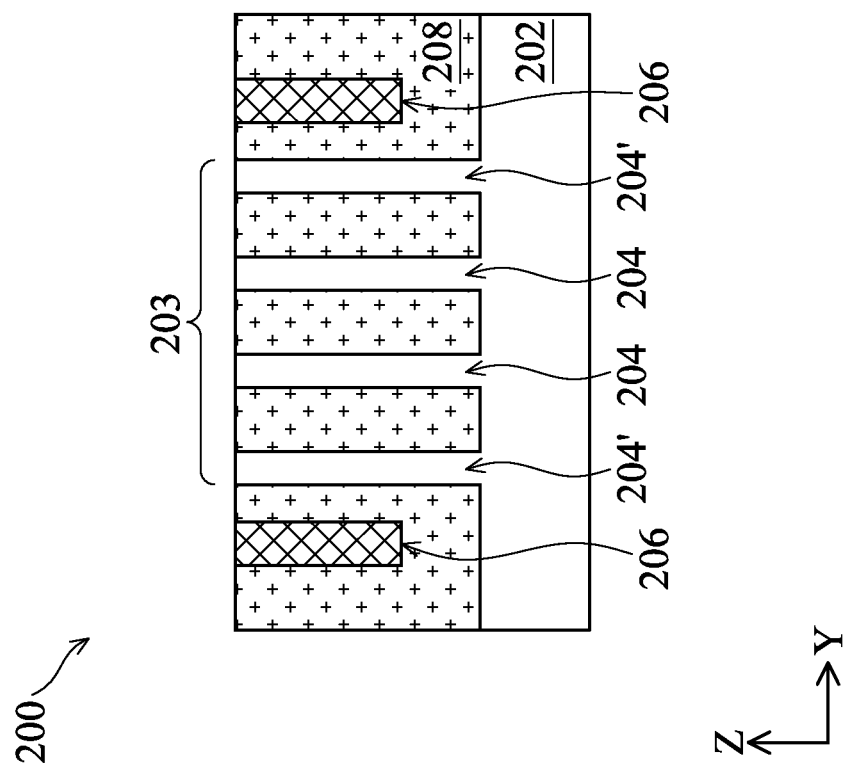

Referring to FIGS. 7 and 8, method 100 at operation 106 forms a dielectric fin (or alternatively referred to as a vertical dielectric feature or a dielectric wall) 206 adjacent and substantially parallel to each outer semiconductor fin 204', i.e., bordering boundaries of the device region 203, to protrude from the isolation structures 208. Referring to FIG. 7, method 100 first patterns the isolation structures 208 to form trenches 209 therein. The trenches 209 may be formed by a series of patterning and etching processes. For example, a masking element (not depicted) including a photoresist layer may be first formed over the isolation structures 208 and patterned in a photolithography process to form a patterned masking element. Subsequently, portions of the isolation structures 208 exposed by the patterned masking element may be removed by one or more suitable etching processes to form the trenches 209, after which the patterned masking element is removed from the device 200 by plasma ashing or resist stripping. In the depicted embodiments, the trenches 209 do not extend to expose the substrate 202, i.e., the trenches 209 are embedded in the isolation structures 208; however, the present disclosure is not limited to such configuration and may be applicable to embodiments in which the trenches 209 expose portions of the substrate 202, such that the subsequently formed dielectric fins 206 vertically extend to contact the substrate 202.

Subsequently, referring to FIG. 8, a dielectric material is deposited in the trenches 209 by any suitable method, such as CVD, FCVD, ALD, other suitable methods, or combinations thereof, and planarized by one or more CMP processes to form the dielectric fins 206 in the isolation structures 208. The dielectric fins 206 may include any suitable dielectric material such as, for example, silicon nitride (SiN), silicon oxide (SiO and/or $SiO_2$), silicon carbide (SiC), carbon-containing silicon nitride (SiCN), carbon-containing silicon oxide (SiOC), oxygen-containing silicon nitride (SiON), carbon-and-oxygen-doped silicon nitride (SiOCN), a low-k dielectric material, hafnium oxide (HfO), aluminum oxide (A10), other suitable dielectric materials, or combinations thereof. In the present embodiments, the composition of the dielectric material differs from that of the isolation structures 208 to ensure sufficient etching selectivity therebetween. Thereafter, referring to FIG. 9, the isolation structures 208 are recessed to expose portions of the semiconductor fins 204 and/or 204' and the dielectric fins 206. In the present embodiments, the isolation structures 208 are recessed by a suitable etching process without etching, or substantially etching, the semiconductor fins 204 and/or 204' and the dielectric fins 206.

Figures 17A, 17B:
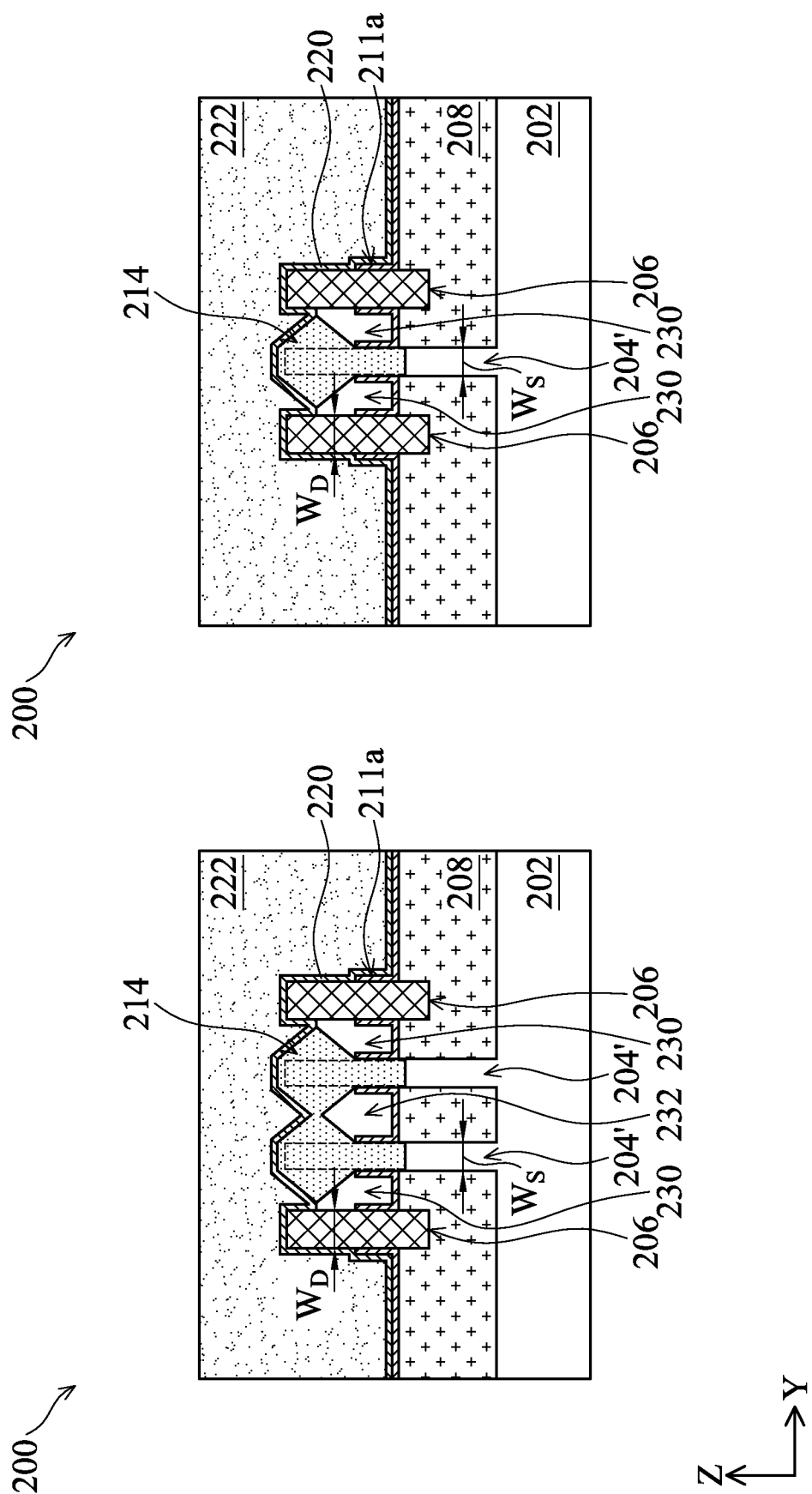
Figures 18A, 18B:
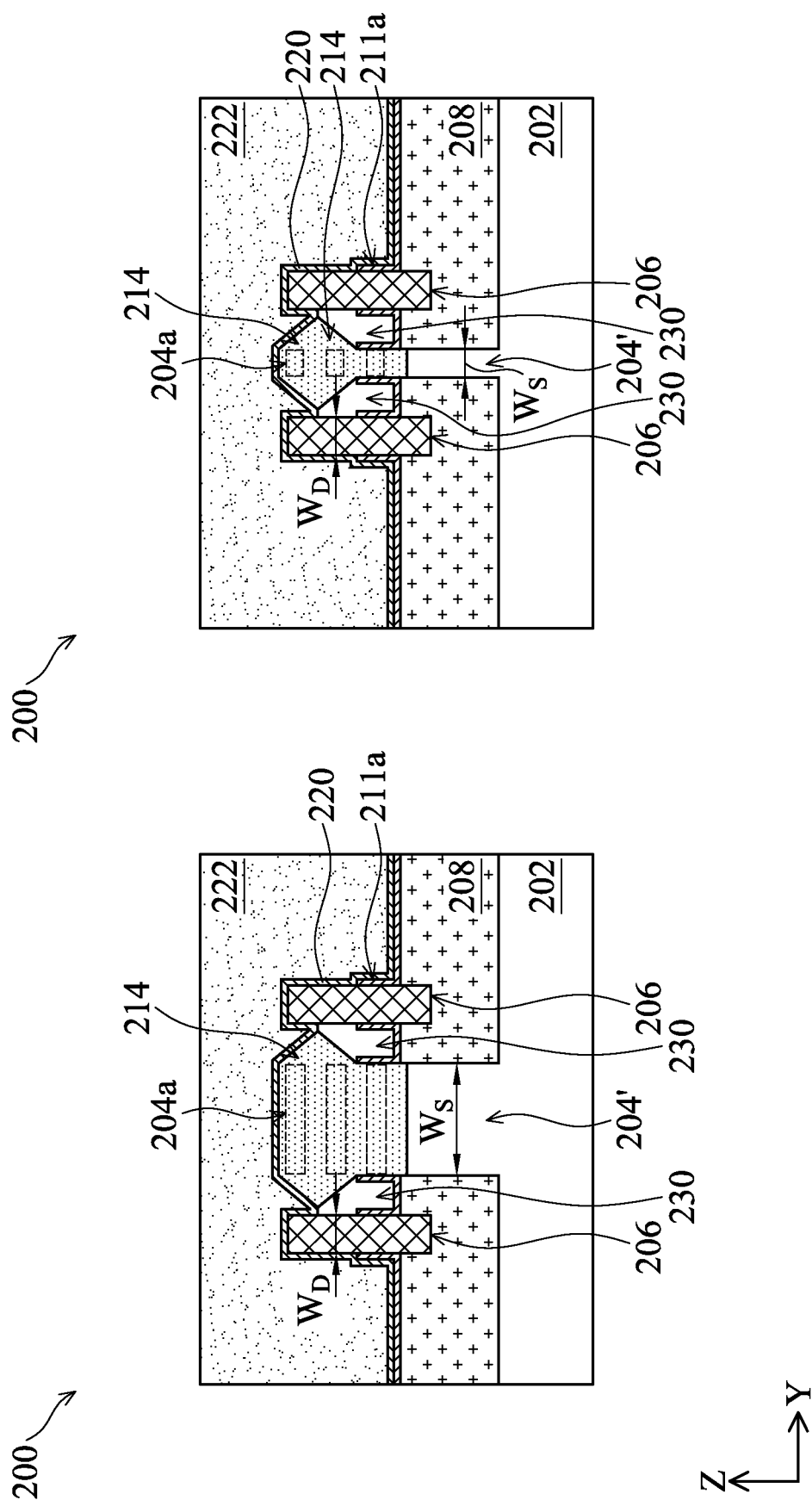

In the present embodiments, two dielectric fins 206 are formed on opposite sides of each device region 203. Stated differently, no dielectric fins 206 are present within the device region 203. Stated in yet another way, the region disposed between two dielectric fins 206 is free of any additional dielectric fin 206. For embodiments in which a single semiconductor fin (e.g., an outer semiconductor fin 204' as depicted in FIGS. 17B, 18A, and 18B) is provided in the device region 203, one dielectric fin 206 is formed adjacent to each of the two sidewalls of the single semiconductor fin, i.e., the single semiconductor fin is disposed between two dielectric fins 206. Furthermore, as depicted in FIG. 9, each dielectric fin 206 is formed at a distance D away from the nearest semiconductor fin, where the distance D is determined based on the size of an epitaxial source/drain (S/D) feature to be formed in the semiconductor fin. In some embodiments, a dummy spacer (not depicted) may be formed between the dielectric fin 206 and an outer semiconductor fin 204', and the distance D is defined by the width of the dummy spacer. As will be discussed in detail below, the distance D is configured to allow the epitaxial S/D feature to contact the dielectric fins 206, thereby enclosing an air gap below the epitaxial S/D feature.

Figure 10C:
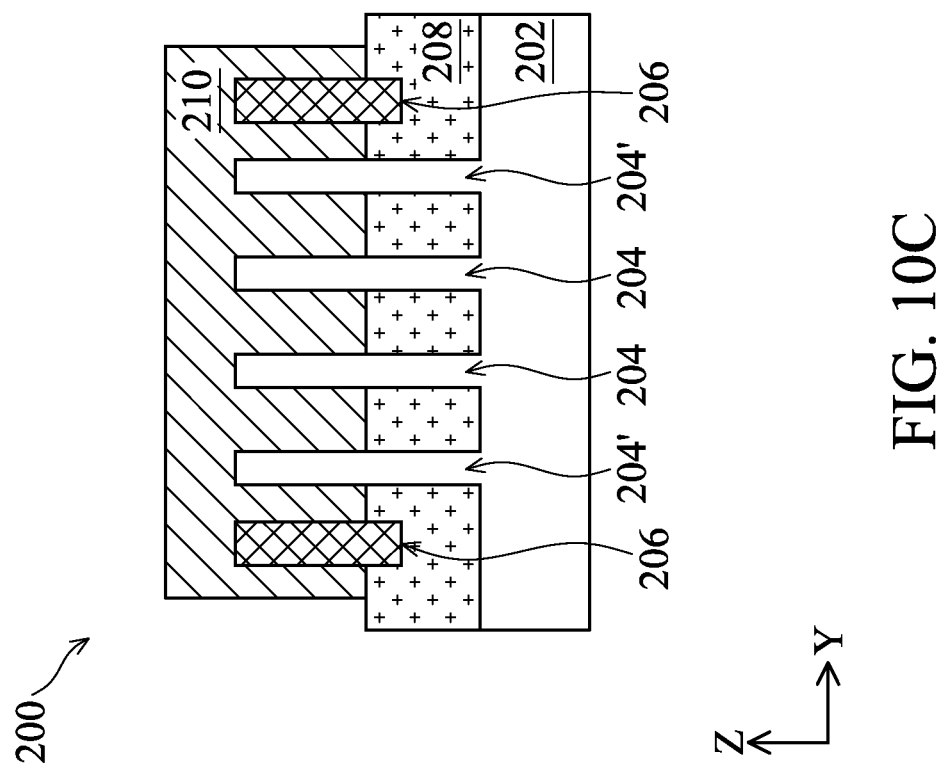

Now referring to FIGS. 10A-10C, method 100 at operation 108 forms a dummy gate structure (i.e., a placeholder gate) 210 including polysilicon over channel regions of the semiconductor fins 204 and/or 204'. FIGS. 10A and 10B illustrate a top view and a three-dimensional perspective view, respectively, of the device 200 after forming the dummy gate structure 210. Cross-sectional views of the device 200 through S/D regions of the semiconductor fins 204 and/or 204', i.e., along the line AA', are depicted in FIGS. 11A, 12A, and 13-18B, and cross-sectional views of the device 200 through channel regions of the semiconductor fins 204 and/or 204', i.e., along the line BB', are depicted in FIGS. 10C, 11B, 12B, and 19A-20B. In the present embodiments, portions of the dummy gate structure 210 are replaced with a metal gate structure after forming other components of the device 200. The dummy gate structure 210 may be formed by a series of deposition and patterning processes. For example, the dummy gate structure 210 may be formed by depositing a polysilicon layer over the device region 203 and performing an etching process (e.g., a dry etching process) to remove portions of the polysilicon and form the dummy gate structure 210. Though not depicted, the device 200 may include an interfacial layer formed over the semiconductor fins 204 and/or 204' by a suitable method, such as thermal oxidation, chemical oxidation, other suitable methods, or combinations thereof, before depositing the polysilicon layer. The dummy gate structure 210 may further include other material layers including a dielectric layer, a hard mask layer, a diffusion layer, a capping layer, other suitable layers, or combinations thereof.

Figure 11B:
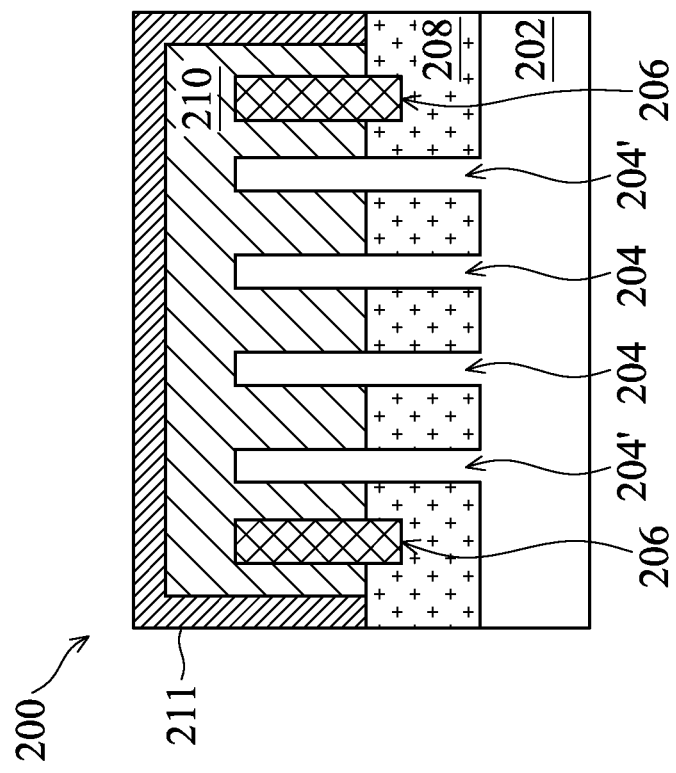
Figure 11A:
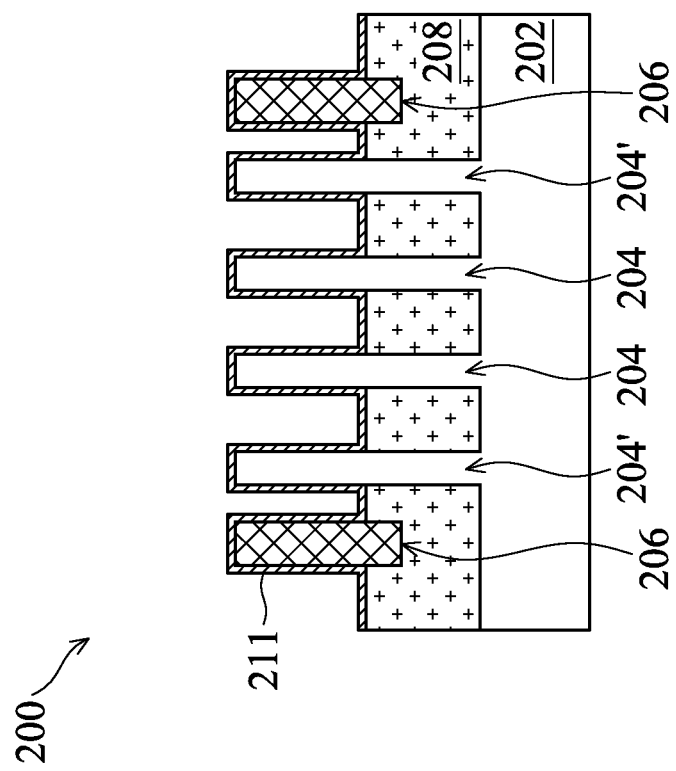

Now referring to FIGS. 11A-12B, method 100 at operation 110 forms gate spacers 211b on sidewalls of the dummy gate structure 210. Referring to FIGS. 11A and 11B, method 100 deposits a spacer layer 211 over the device 200, such that the spacer layer 211 is formed conformally over the semiconductor fins 204 and/or 204' and the dummy gate structure 210. The spacer layer 211 may be a single-layer structure or a multi-layer structure and may include silicon nitride, silicon oxide (SiO and/or SiO$_2$), silicon carbide (SiC), carbon-containing silicon nitride (SiCN), carbon-containing silicon oxide (SiOC), oxygen-containing silicon nitride (SiON), carbon-and-oxygen-doped silicon nitride (SiOCN), a low-k dielectric material, hafnium oxide (HfO), aluminum oxide (AlO), other suitable dielectric materials, or combinations thereof. In the present embodiments, the composition of the spacer layer 211 is different from the composition of the dielectric fins 206 to ensure etching selectivity between the gate spacers 211b and the dielectric fins 206 when subjected to an etchant. In some embodiments, the dielectric fins 206 include a dielectric material having a dielectric constant that is lower than that of the spacer layer 211 in an effort to lower the parasitic capacitance of the device 200. The spacer layer 211 may be formed by any suitable method, such as CVD, FCVD, ALD, PVD, other suitable methods, or combinations thereof. Subsequently, referring to FIG. 12B, method 100 implements an anisotropic etching process (e.g., a dry etching process) to the spacer layer 211, leaving portions of the spacer layer 211 on the sidewalls of the dummy gate structure 210 as the gate spacers 211b. In some embodiments, referring to FIG. 12A, forming the gate spacers 211b leaves portions of the spacer layer 211 on the sidewalls of the semiconductor fins 204 and/or 204' and the dielectric fins 206 as fin spacers 211a. In the present embodiments, an etchant is selected such that etching the spacer layer 211 does not etch, or does not substantially etch, the dielectric fins 206. As depicted herein, the fin spacers 211a are formed on bottom portions of the sidewalls of the semiconductor fins 204 and/or 204' and the dielectric fins 206.

Referring to FIG. 13, method 100 at operation 112 forms an S/D recess 213 in the S/D region of each of the semiconductor fins 204 and/or 204'. In the present embodiments, method 100 forms the S/D recesses 213 by selectively etching the semiconductor fins 204 and/or 204' without etching, or substantially etching, the dielectric fins 206 and the fin spacers 211a. In some embodiments, method 100 implements a dry etching process that utilizes, for example, a chlorine-containing etchant including $Cl_2$, $SiCl_4$, $BCl_3$, other chlorine-containing gas, or combinations thereof. Additionally or alternatively, other etching process(es) and etchant(s) may be utilized if the semiconductor fins 204 and/or 204' include the ML as depicted in FIGS. 5A and 5B. In some embodiments, the etching process may be tuned by adjusting duration, temperature, pressure, source power, bias voltage, bias power, etchant flow rate, and/or other suitable parameters to control a depth of the S/D recesses 213. A cleaning process may subsequently be performed to clean the S/D recesses 213 with a hydrofluoric acid (HF) solution or other suitable solution.

For embodiments in which the semiconductor fins 204 and/or 204' include the ML, i.e., configured to form a GAA FET, method 100 at operation 114 forms inner spacers (not depicted) on portions of the non-channel layers 204b exposed in the S/D recesses 213. The inner spacers may include any suitable dielectric material comprising silicon, carbon, oxygen, nitrogen, other elements, or combinations thereof. For example, the inner spacers may include silicon nitride (SiN), silicon oxide (SiO and/or SiO2), silicon carbide (SiC), carbon-containing silicon nitride (SiCN), carbon-containing silicon oxide (SiOC), oxygen-containing silicon nitride (SiON), silicon, carbon-and-oxygen-doped silicon nitride (SiOCN), a low-k dielectric material, tetraethylorthosilicate (TEOS), doped silicon oxide (e.g., borophosphosilicate glass (BPS G), fluoride-doped silicate glass (FSG), phosphosilicate glass (PSG), boron-doped silicate glass (BSG), etc.), air, other suitable dielectric material, or combination thereof. The inner spacers may each be configured as a single-layer structure or a multi-layer structure including a combination of the dielectric materials provided herein. In some embodiments, the inner spacers have a different composition from that of the gate spacers 211b (and the fin spacers 211a).

Method 100 may form the inner spacers in a series of etching and deposition processes. For example, forming the inner spacers may begin with selectively removing portions of the non-channel layers 204b without removing or substantially removing portions of the channel layers 204a to form trenches. The non-channel layers 204b may be removed by any suitable process, such as a dry etching process. Subsequently, one or more dielectric layers are formed in the trenches, followed by one or more etching processes to remove (i.e., etch back) excess dielectric layer(s) deposited on exposed surfaces of the channel layers 204a, thereby forming the inner spacers on the non-channel layers 204b. The one or more dielectric layers may be deposited by any suitable method, such as ALD, CVD, PVD, other suitable methods, or combinations thereof.

Referring to FIG. 14, method 100 at operation 116 forms the epitaxial S/D feature 214 in each S/D recess 213. Each of the epitaxial S/D features 214 may be suitable for forming a p-type FET device (e.g., including a p-type epitaxial material) or alternatively, an n-type FET device (e.g., including an n-type epitaxial material). The p-type epitaxial material may include one or more epitaxial layers of silicon germanium (epi SiGe) doped with a p-type dopant such as boron, germanium, indium, other p-type dopants, or combinations thereof. The n-type epitaxial material may include one or more epitaxial layers of silicon (epi Si) or silicon carbon (epi SiC) doped with an n-type dopant such as arsenic, phosphorus, other n-type dopants, or combinations thereof. In some embodiments, the epitaxial S/D features 214 merge together as depicted herein; however, the present embodiments are not limited as such.

In some embodiments, one or more epitaxial growth processes are performed to grow an epitaxial material in each S/D recess 213. For example, method 100 may implement an epitaxy growth process as discussed above with respect to forming the channel layers 204a and the non-channel layers 204b of the ML. In some embodiments, the epitaxial material is doped in-situ by adding a dopant to a source material during the epitaxial growth process. In some embodiments, the epitaxial material is doped by an ion implantation process after performing a deposition process. In some embodiments, an annealing process is subsequently performed to activate the dopants in the epitaxial S/D features 214.

In the present embodiments, the epitaxial S/D feature 214 formed adjacent to one of the dielectric fins 206 is configured to contact that dielectric fin 206, thereby forming an outer air gap 230 near a bottom portion of the epitaxial S/D feature 214. In other words, the epitaxial S/D features 214 formed at edges of the device region 203 laterally grow to touch a sidewall of their respective neighboring dielectric fin 206. In the depicted embodiments, each outer air gap 230 is defined by the epitaxial S/D feature 214, the dielectric fin 206, and portions of the fin spacers 211a. In some embodiments, two adjacent epitaxial S/D features 214 merge together to form an inner air gap 232 in a space between bottom portions of the epitaxial S/D features 214. Each inner air gap 232 may be further defined by portions of the fin spacers 211a. As discussed above with respect to FIG. 9, the distance D between a dielectric fin 206 and its neighboring semiconductor fin (i.e., an outer semiconductor fin 204') is configured to allow the epitaxial S/D feature 214 to grow laterally until it contacts the sidewall of the dielectric fin 206. Therefore, in the present embodiments, a lateral dimension (i.e., the dimension measured along the Y direction)—and therefore the volume—of the outer air gap 230 depends on the magnitude of the distance D.

A general strategy for improving performance (e.g., processing speed) of an FET is to reduce the device's parasitic capacitance, which lowers the RC delay of the device. Reducing parasitic capacitance may be implemented by incorporating materials with lower dielectric constant, such as air in the form of an air gap, into the device's structure. While existing methods of introducing air gap(s) in an FET have generally adequate, they have not been entirely satisfactory in all aspects. For example, when a device includes two or more semiconductor fins (active regions), parasitic capacitance of the FET may be reduced by merging neighboring S/D features formed over the semiconductor fins to create inner air gap(s) below the S/D features, such as the inner air gaps 232 provided herein. However, when devices continue to decrease in size, the number of semiconductor fins within a given device may be reduced to less than two, thus preventing the formation of any inner air gap. The present embodiments provide methods of forming additional air gaps, such as the outer air gaps 230 provided herein, adjacent to the outermost semiconductor fins, such that at least two air gaps (i.e., the outer air gaps 230) are configured for each device regardless of how many semiconductor fins are present. In the present embodiments, incorporating dielectric fins adjacent to the outer semiconductor fins increases the total number of air gaps in a device by two, which is especially advantageous for embodiments in which only one semiconductor fin is present. In some embodiments, the total number of air gaps formed within a device exceeds the number of semiconductor fins present, thereby maximizing the capacitance-reducing effect of the air gaps.

Figures 15A, 15B:
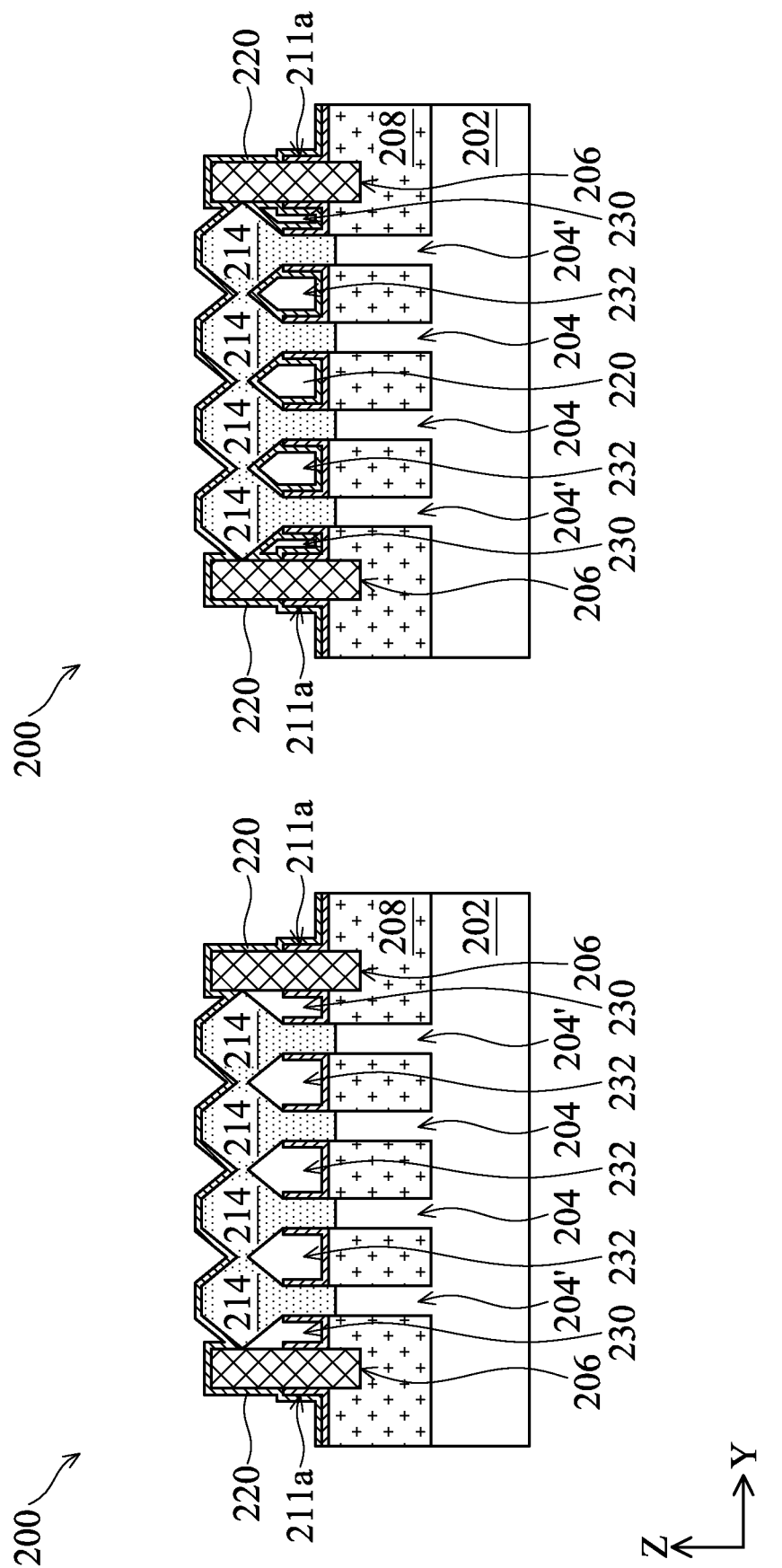

Referring to FIGS. 15A and 15B, method 100 at operation 118 forms an etch-stop layer (ESL) 220 over the device 200. The ESL 220 may include silicon nitride (SiN), carbon-containing silicon nitride (SiCN), oxygen-containing silicon nitride (SiON), silicon, carbon-and-oxygen-doped silicon nitride (SiOCN), other suitable materials, or combinations thereof. In some embodiments, the dielectric fins 206 include a dielectric material having a dielectric constant that is lower than that of the fin spacers 211a and/or the ESL 220 in an effort to lower the parasitic capacitance of the device 200. In the present embodiments, the ESL 220 is formed conformally over the device 200 by CVD, PVD, ALD, other suitable methods, or combinations thereof. Referring to FIG. 15A, the ESL 220 is formed over top surface of the merged epitaxial S/D features 214 and the dielectric fins 206 but does not fill the air gap 230 or the air gap 232. Alternatively, referring to FIG. 15B, in addition to being formed over the top surface of the merged epitaxial S/D features 214 and the dielectric fins 206, the ESL 220 may partially fill the air gap 230 and the air gap 232, thereby reducing, though not eliminating, volume of each air gap. Such partial filling of the air gap 230 and the air gap 232 by the ESL 220 may occur when the epitaxial S/D features 214 only merge slightly, which leads to enlarged volume of the air gap 230 and the air gap 232.

Figures 16A, 16B:
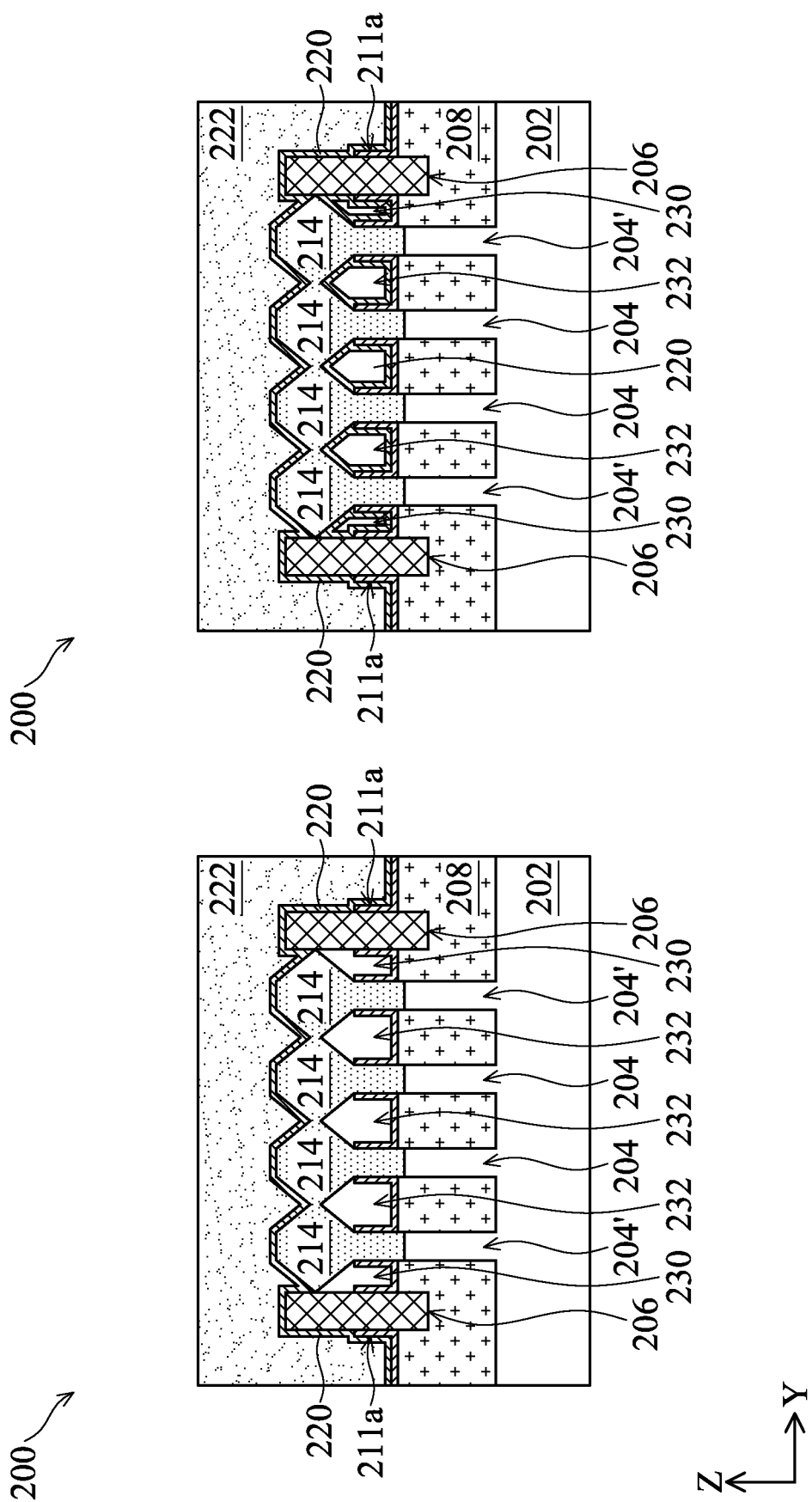
Figures 16C, 16D:
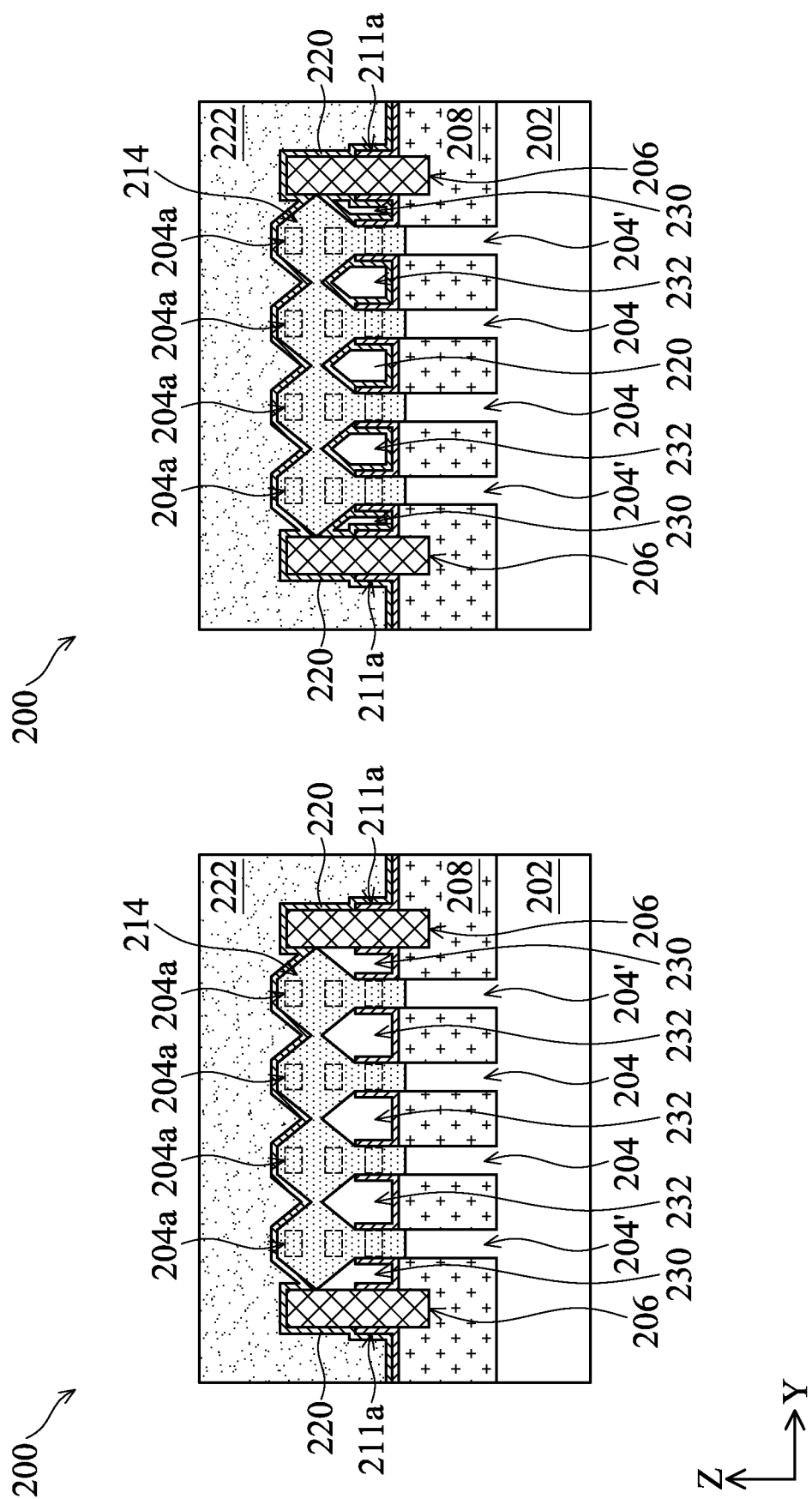

Subsequently, referring to FIGS. 16A and 16B which correspond to FIGS. 15A and 15B, respectively, method 100 at operation 118 forms an interlayer dielectric (ILD) layer 222 over the ESL 220. The ILD layer 222 may include silicon oxide (SiO and/or SiO2), a low-k dielectric material, TEOS, doped silicon oxide (e.g., BPSG, FSG, PSG, BSG, etc.), other suitable dielectric materials, or combinations thereof, and may be formed by CVD, FCVD, SOG, other suitable methods, or combinations thereof. Thereafter, method 100 may planarize the ILD layer 222 in one or more CMP processes to expose a top surface of the dummy gate structure 210. FIGS. 16C and 16D depict embodiments of the device 200 similar to those of FIGS. 16A and 16B with the exception that the semiconductor fins 204 and/or 204' each include the channel layers 204a interleaved with non-channel layers (not depicted) as depicted in FIGS. 5A and 5B and configured to form GAA FET(s).

In the present embodiments, a number M of the outer air gap 230 is consistent with the number of dielectric fins 206, which is two regardless of the number N of the semiconductor fins 204 and/or 204'. A number P of the inner air gaps 232, on the other hand, depends upon a number N' of the epitaxial S/D features 214 merged together, e.g., if N' is zero, then no inner air gaps 232 are formed, P=0; otherwise, P=N'−1. Accordingly, in the absence of any dielectric fins 206, merging two adjacent epitaxial S/D features 204 would yield no outer air gaps 230, or M=0, and no more than a total of (N'−1) inner air gaps 232, or (M+P)<(N'−1). Embodiments provided herein are configured to reduce the parasitic capacitance of the device 200 by maximizing the total number (M+P) of the air gaps with respect to the number N of the semiconductor fins 204 and/or 204' in the device region 203. In one example, referring to FIGS. 14-16B, because the device 200 includes two dielectric fins 206 and four merged epitaxial S/D features 214 and/or 204', or N=N'=4, there are two outer air gaps 230 (M=2) and three inner air gaps 232, or P=N'−1=3, and the total number of air gaps is M+P=5, which is greater than N. In a similar example, referring to FIG. 17A, because the device 200 includes two dielectric fins 206 and two merged epitaxial S/D features 214, N=N'=2, there are two outer air gaps 230 (M=2) and one inner air gap 232 (P=1), and the total number of air gaps is M+P=3, which greater than N.

For embodiments in which the device 200 includes a single semiconductor fin 204' (N=1), referring to FIGS. 17B, 18A, and 18B, no inner air gap 232 is formed, or P=0, and the total number of air gaps therefore arises solely from the outer air gaps 230 formed by the single semiconductor fin 204' and the two dielectric fins 206. In this regard, the total number of air gaps is M+P=2, which is greater than N. In the absence of any dielectric fin 206, however, no air gap would be formed to reduce the parasitic capacitance of the device 200, or M+P=0. Thus, the dielectric fins 206 reduces the parasitic capacitance of a device by providing two additional outer air gaps with the outer semiconductor fins 204', and the effect of such reduction is especially beneficial when the device includes a single semiconductor fin 204'.

It is noted that the formation of the outer air gaps 230 is not dependent on specific configurations of the semiconductor fins 204 and/or 204'. In other words, the semiconductor fins 204 and/or 204' may be configured to form FinFETs (as depicted in FIGS. 17A and 17B) and/or GAA FETs (as depicted in FIGS. 18A and 18B). Furthermore, embodiments provided herein may be applicable to various configurations of the GAA FETs, such as nanosheet-based GAA FET as depicted in FIG. 18A and nanorod-based GAA FET as depicted in FIG. 18B. Still further, the present embodiments do not limit the width $W_S$ of the semiconductor fins 204 and 204' or the width $W_D$ of the dielectric fins 206 to specific values. For example, referring to FIGS. 17A, 17B, and 18B, $W_S$ is less than $W_D$, and referring to FIG. 18A, $W_S$ is greater than $W_D$. Of course, $W_S$ may be substantially the same as $W_D$ according to some embodiments (not depicted).

Figures 19A, 19B:
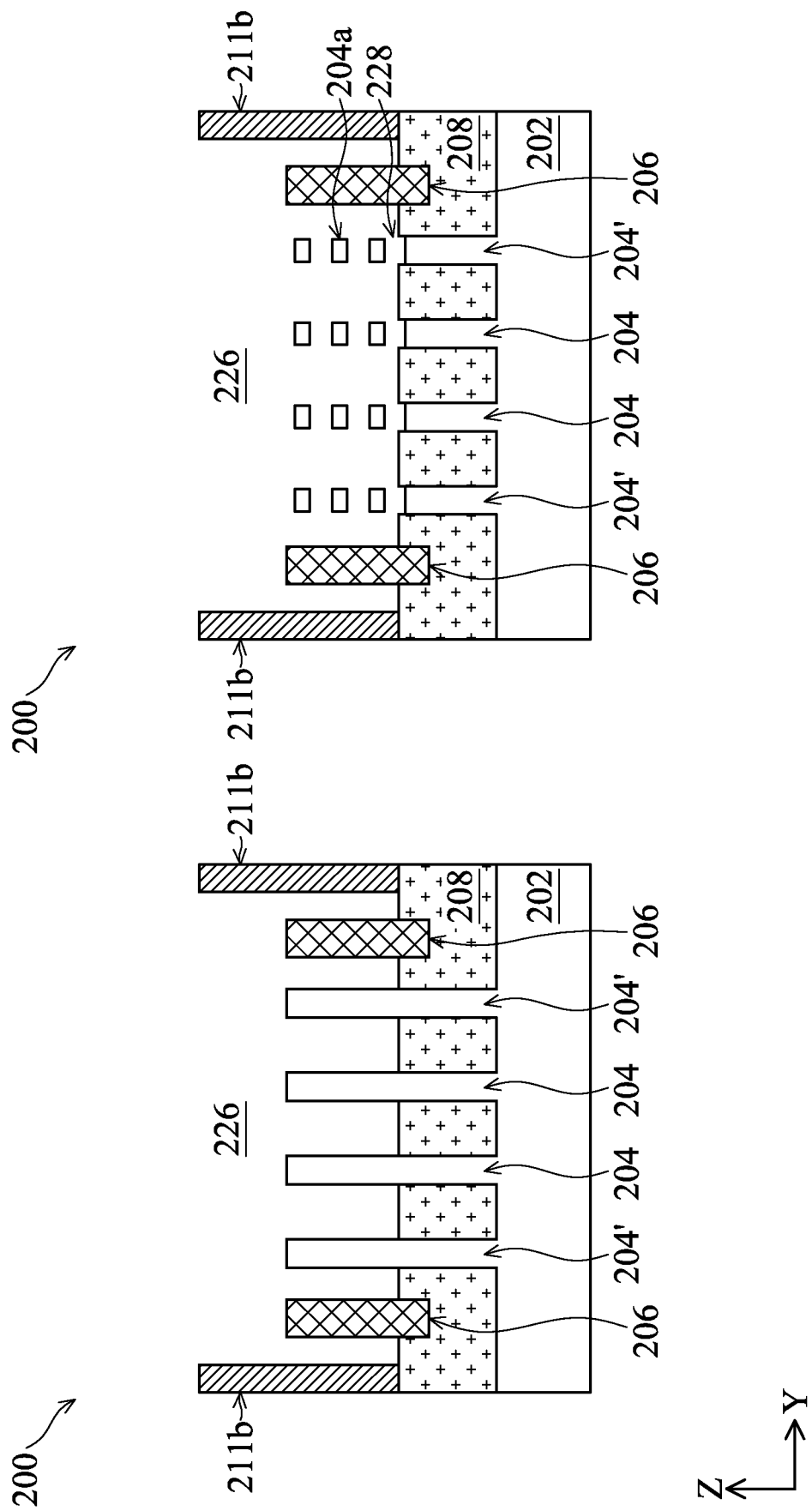

Now referring to FIG. 19A, method 100 at operation 120 removes the dummy gate structure 210 to form a gate trench 226 by any suitable etching process, such as a dry etching process, thereby exposing channel regions of the semiconductor fins 204 and/or 204'. In some embodiments, the interfacial layer, if present, remains over the semiconductor fins 204 and/or 204' in the gate trench 226.

For embodiments in which the semiconductor fins 204 and/or 204' include the ML configured to form GAA FETs, referring to FIG. 19B, method 100 proceeds from operation 120 to operation 122 to remove the non-channel layers 204b from the ML, thereby forming openings 228 interleaved with the channel layers 204a. Method 100 selectively removes the non-channel layers 204b without removing, or substantially removing, the channel layers 204a by any suitable etching process, such as dry etching, wet etching, RIE, or combinations thereof. In one example, a wet etching process employing ammonia ($NH_3$) and/or hydrogen peroxide ($H_2O_2$) may be performed to selectively remove the non-channel layers 204b. In another example, a dry etching process employing HF and/or other fluorine-based etchant(s), such as $CF_4$, $SF_6$, $CH_2F_2$, $CHF_3$, $C_2F_6$, other fluorine-containing etchants, or combinations thereof, may be implemented to remove the non-channel layers 204b.

Figures 20A, 20B:
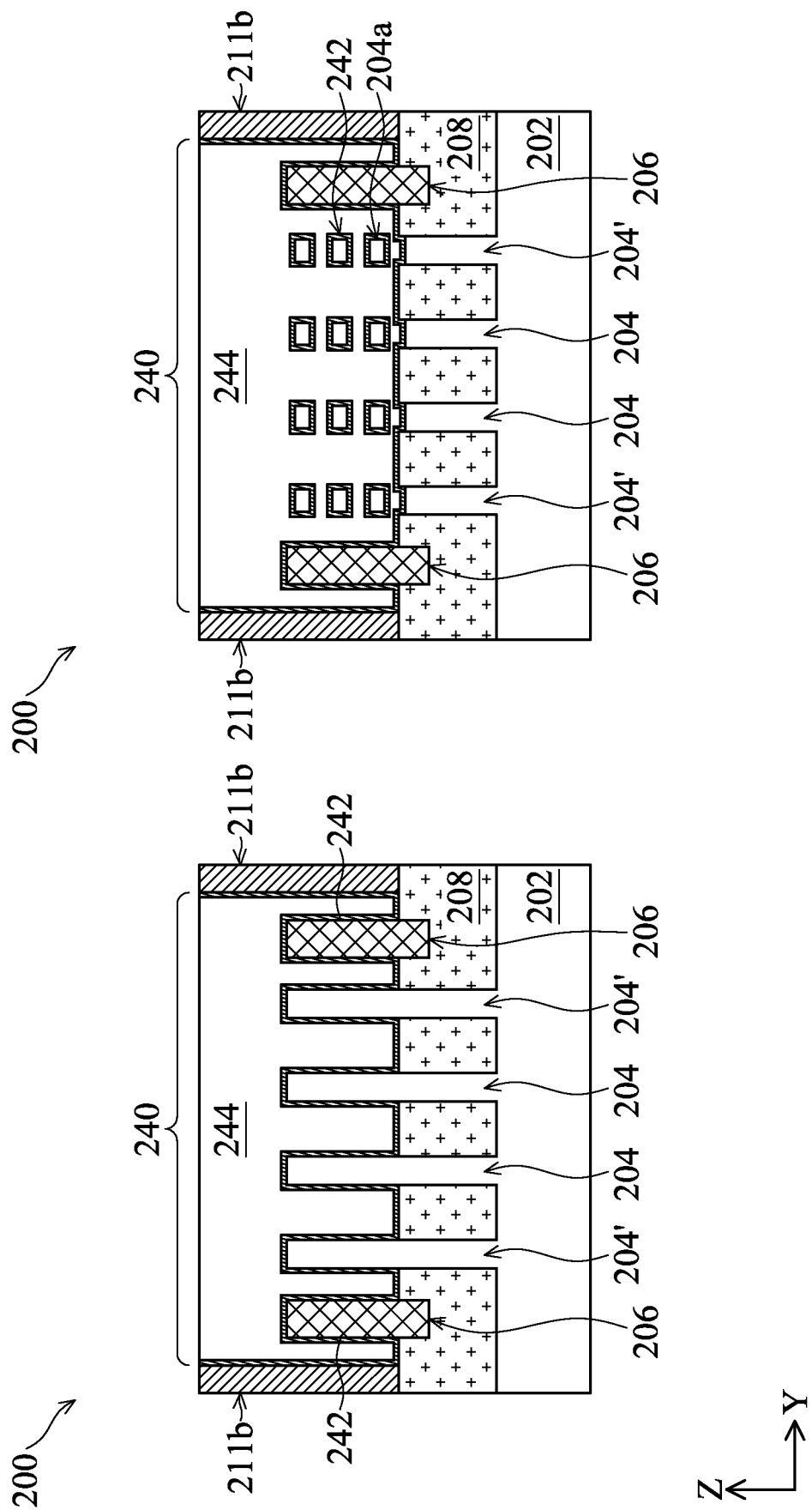

Subsequently, referring to FIGS. 20A and 20B, which correspond to FIGS. 19A and 19B, respectively, method 100 at operation 124 forms a metal gate structure 240 over the channel region of each of the semiconductor fins 204 and/or 204', i.e., in the gate trench 226 and, if applicable, in the openings 228, where the metal gate structure 240 includes at least a gate dielectric layer 242 and a metal gate electrode 244 disposed over the gate dielectric layer 242. For embodiments in which the semiconductor fins 204 and/or 204' include the ML configured to form GAA FETs, referring to FIG. 20B, the gate dielectric layer 242 wraps around each channel layer 204a, and the metal gate electrode 244 is configured to fill in the openings 228 between the channel layers 204a as well as in the gate trench 226.

In the present embodiments, the gate dielectric layer 242 includes any suitable high-k (i.e., having a dielectric constant greater than that of silicon oxide, which is about 3.9) dielectric material, such as hafnium oxide, lanthanum oxide, other suitable materials, or combinations thereof. The metal gate electrode 244 may include at least one work function metal layer (not depicted separately) and a bulk conductive layer (not depicted separately) disposed thereover. The work function metal layer may be a p-type or an n-type work function metal layer. Example work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The bulk conductive layer may include Cu, W, Al, Co, Ru, other suitable materials, or combinations thereof. The metal gate structure 240 may further include numerous other layers (not depicted), such as an interfacial layer, a capping layer, a barrier layer, other suitable layers, or combinations thereof. Various layers of the metal gate structure 240 may be deposited by any suitable method, such as chemical oxidation, thermal oxidation, ALD, CVD, PVD, plating, other suitable methods, or combinations thereof.

Thereafter, method 100 at operation 126 may perform additional processing steps to the device 200. For example, method 100 may form S/D contacts (not depicted) over the S/D features 214, where each S/D contact may include any suitable conductive material, such as Co, W, Ru, Cu, Al, Ti, Ni, Au, Pt, Pd, other suitable conductive materials, or combinations thereof. Method 100 may form an S/D contact opening in the ILD layer 222 via a series of patterning and etching processes and subsequently deposit a conductive material in the S/D contact opening using any suitable method, such as CVD, ALD, PVD, plating, other suitable processes, or combinations thereof. In some embodiments, a silicide layer (not depicted) is formed between the S/D features 214 and the S/D contact. The silicide layer may include nickel silicide, cobalt silicide, tungsten silicide, tantalum silicide, titanium silicide, platinum silicide, erbium silicide, palladium silicide, other suitable silicide, or combinations thereof. The silicide layer may be formed over the device 200 by a deposition process such as CVD, ALD, PVD, or combinations thereof. Subsequently, method 100 may form additional features over the device 200 such as, for example, a gate contact (not depicted) configured to be coupled with the metal gate structure 240, vertical interconnect features (e.g., vias; not depicted), horizontal interconnect features (e.g., conductive lines; not depicted), additional intermetal dielectric layers (e.g., ESLs and ILD layers; not depicted), other suitable features, or combinations thereof.

Although not intended to be limiting, one or more embodiments of the present disclosure provide many benefits to a semiconductor device and the formation thereof. For example, in the present embodiments, parasitic capacitance of a device (e.g., a FinFET, a GAA FET, etc.) is reduced by forming vertical dielectric features (e.g., dielectric fins) adjacent to epitaxial S/D features of the device. In some embodiments, forming the dielectric fins introduces air gaps at bottom of those semiconductor fins disposed at outer edges of a device region that includes an array of semiconductor fins. As provided herein, introducing air gap to the outer (or edge) semiconductor fins is important for reducing parasitic capacitance of the device when efforts of decreasing the number of semiconductor fins (also known as fin depopulation) are implemented. In some embodiments of the present disclosure, the number of semiconductor fins may be reduced to two or less. Embodiments of the disclosed methods can be readily integrated into existing processes and technologies for manufacturing various FETs.

In one aspect, the present embodiments provide a semiconductor structure that includes a semiconductor fin protruding from a substrate, an S/D feature disposed over the semiconductor fin, and a first dielectric fin and a second dielectric fin disposed over the substrate, where the semiconductor fin is disposed between the first dielectric fin and the second dielectric fin, where a first air gap is enclosed by a first sidewall of the epitaxial S/D feature and the first dielectric fin, and where a second air gap is enclosed by a second sidewall of the epitaxial S/D feature and the second dielectric fin.

In another aspect, the present embodiments provide a semiconductor structure that includes a first semiconductor fin and a second semiconductor fin disposed over a substrate and oriented lengthwise along a first direction, a gate stack disposed over a first channel region of the first semiconductor fin and a second channel region of the second semiconductor fin and oriented lengthwise along a second direction substantially perpendicular to the first direction, a first S/D feature and a second S/D feature disposed over the first semiconductor fin and the second semiconductor fin, respectively, and a first dielectric fin and a second dielectric fin disposed over the substrate and oriented lengthwise along the first direction, where the first semiconductor fin and the second semiconductor fin are disposed between the first dielectric fin and the second dielectric fin, where the first dielectric fin forms a first air gap with the first S/D feature, and where the second dielectric fin forms a second air gap with the second S/D feature. In the present embodiments, the first channel region and the second channel region each includes a plurality of semiconductor layers interleaved with the gate stack.

In yet another aspect, the present embodiments include forming a semiconductor fin protruding from a substrate, forming a dielectric fin adjacent to the semiconductor fin, where the dielectric fin is oriented substantially parallel to the semiconductor fin, removing a portion of the semiconductor fin to form an S/D recess, and forming an S/D feature in the S/D recess, such that the S/D feature contacts a sidewall of the dielectric fin, thereby defining an air gap.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor fin protruding from a substrate;
   an epitaxial source/drain (S/D) feature disposed over the semiconductor fin;
   a first dielectric fin and a second dielectric fin disposed over the substrate, wherein the semiconductor fin is disposed between the first dielectric fin and the second dielectric fin, wherein a first air gap is enclosed by a first sidewall of the epitaxial S/D feature and the first dielectric fin, and wherein a second air gap is enclosed by a second sidewall of the epitaxial S/D feature and the second dielectric fin; and
   an etch-stop layer disposed over the epitaxial S/D feature, the first dielectric fin, and the second dielectric fin.

2. The semiconductor structure of claim 1, further comprising spacers disposed on portions of the epitaxial S/D feature, the first dielectric fin, and the second dielectric fin, such that the first air gap and the second air gap are each partially defined by the spacers.

3. The semiconductor structure of claim 2, wherein the spacers include a first dielectric material with a first dielectric constant and the first dielectric fin and the second dielectric fin each include a second dielectric material with a second dielectric constant, and wherein the first dielectric constant is different from the second dielectric constant.

4. The semiconductor structure of claim 3, wherein the first dielectric constant is greater than the second dielectric constant.

5. The semiconductor structure of claim 1, wherein the first air gap and the second air gap are each partially defined by the etch-stop layer.

6. The semiconductor structure of claim 1, further comprising a metal gate stack disposed over a channel region of the semiconductor fin adjacent to the epitaxial S/D feature, wherein the channel region of the semiconductor fin includes a stack of semiconductor layers interleaved with the metal gate stack.

7. The semiconductor structure of claim 1, wherein the semiconductor fin is defined by a first width and each of the first and the second dielectric fins is defined by a second width in a direction substantially perpendicular to a lengthwise direction of the semiconductor fin, and wherein the first width is different from the second width.

8. The semiconductor structure of claim 7, wherein the first width is greater than the second width.

9. The semiconductor structure of claim 1, wherein top surfaces of the first dielectric fin and the second dielectric fin are coplanar with a top surface of the semiconductor fin.

10. A semiconductor structure, comprising:
    a first semiconductor fin and a second semiconductor fin disposed over a substrate and oriented lengthwise along a first direction;
    a gate stack disposed over a first channel region of the first semiconductor fin and a second channel region of the second semiconductor fin and oriented lengthwise along a second direction substantially perpendicular to the first direction, wherein the first channel region and the second channel region each includes a plurality of semiconductor layers interleaved with the gate stack;
a first source/drain (S/D) feature and a second S/D feature disposed over the first semiconductor fin and the second semiconductor fin, respectively; and
a first dielectric fin and a second dielectric fin disposed over the substrate and oriented lengthwise along the first direction, wherein the first semiconductor fin and the second semiconductor fin are disposed between the first dielectric fin and the second dielectric fin, wherein the first dielectric fin forms a first air gap with the first S/D feature, and wherein the second dielectric fin forms a second air gap with the second S/D feature.

11. The semiconductor structure of claim 10, wherein the first S/D feature and the second S/D feature merge to form a third air gap.

12. The semiconductor structure of claim 10, further comprising:
a third semiconductor fin disposed between the first semiconductor fin and the second semiconductor fin; and
a third S/D feature disposed over the third semiconductor fin, wherein the first S/D feature, the second S/D feature, and the third S/D feature merge to form a third air gap between the first S/D feature and the second S/D feature and a fourth air gap between the second S/D feature and the third S/D feature.

13. The semiconductor structure of claim 10, further comprising isolation structures disposed over the substrate, wherein portions of the isolation structure separate the first dielectric fin and the second dielectric fin from the substrate.

14. The semiconductor structure of claim 10, further comprising an etch-stop layer disposed between a bottom portion of the first S/D feature and the first dielectric fin and between a bottom portion of the second S/D feature and the second dielectric fin, such that the first air gap and the second air gap are each enclosed by the etch-stop layer.

15. The semiconductor structure of claim 10, further comprising spacers disposed on portions of the first S/D feature, the second S/D feature, the first dielectric fin, and the second dielectric fin, such that the first air gap and the second air gap are each partially enclosed by the spacers, wherein a dielectric constant of the first dielectric fin or the second dielectric fin is less than a dielectric constant of the spacers.

16. A method, comprising:
forming a semiconductor fin protruding from a substrate;
depositing a dielectric layer over the substrate;
planarizing the dielectric layer until a top surface of the dielectric layer is coplanar with a top surface of the semiconductor fin;
forming a trench in the dielectric layer and adjacent to the semiconductor fin;
forming a dielectric fin in the trench, wherein the dielectric fin is oriented substantially parallel to the semiconductor fin;
removing a portion of the semiconductor fin to form a source/drain (S/D) recess; and
forming an S/D feature in the S/D recess, such that the S/D feature contacts a sidewall of the dielectric fin, thereby defining an air gap.

17. The method of claim 16, further comprising, before forming the S/D recess:
depositing a spacer layer over the semiconductor fin and the dielectric fin; and
recessing the spacer layer to form spacers at bottom portions of the semiconductor fin and the dielectric fin, such that a bottom portion of the S/D feature is disposed between the spacers and that the air gap is partially enclosed by the spacers.

18. The method of claim 16, further comprising forming an etch-stop layer over the S/D feature and the dielectric fin, such that the etch-stop layer partially fills the air gap.

19. The method of claim 16, wherein the dielectric fin is a first dielectric fin and the air gap is a first air gap, the method further comprising forming a second dielectric fin adjacent and substantially parallel to the semiconductor fin, such that the semiconductor fin is disposed between the first dielectric fin and the second dielectric fin, wherein the S/D feature is formed in the S/D recess to contact a sidewall of the second dielectric fin, thereby defining a second air gap.

20. The method of claim 16, wherein the semiconductor fin is a first semiconductor fin, the dielectric fin is a first dielectric fin, the S/D feature is a first S/D feature, and the air gap is a first air gap, the method further comprising:
forming a second semiconductor fin adjacent and substantially parallel to the first semiconductor fin;
forming a second dielectric fin substantially parallel to the first semiconductor fin, wherein the first semiconductor fin and the second semiconductor fin are disposed between the first dielectric fin and the second dielectric fin; and
forming a second S/D feature over the second semiconductor fin, wherein the second S/D feature contacts a sidewall of the second dielectric fin to form a second air gap, and wherein the first S/D feature and the second S/D feature merge to form a third air gap.

* * * * *